(12) United States Patent
Railkar et al.

(10) Patent No.: US 8,946,904 B2
(45) Date of Patent: Feb. 3, 2015

(54) SUBSTRATE VIAS FOR HEAT REMOVAL FROM SEMICONDUCTOR DIE

(75) Inventors: Tarak A. Railkar, Plano, TX (US);
Ashish Alawani, San Jose, CA (US);
Ray Parkhurst, Santa Clara, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 303 days.

(21) Appl. No.: 12/869,844

(22) Filed: Aug. 27, 2010

(65) Prior Publication Data

US 2012/0049345 A1     Mar. 1, 2012

(51) Int. Cl.

| | | |
|---|---|---|
| *H01L 23/495* | (2006.01) | |
| *H01L 23/053* | (2006.01) | |
| *H01L 23/14* | (2006.01) | |
| *H01L 23/48* | (2006.01) | |
| *H01L 23/52* | (2006.01) | |
| *H01L 29/40* | (2006.01) | |
| *H05K 7/00* | (2006.01) | |
| *H05K 7/20* | (2006.01) | |
| *H01L 23/498* | (2006.01) | |
| *H01L 23/367* | (2006.01) | |

(52) U.S. Cl.
CPC ...... *H01L 23/49822* (2013.01); *H01L 23/3677* (2013.01); *H01L 23/49827* (2013.01); *H01L 2924/09701* (2013.01); *H01L 2224/16225* (2013.01); *H01L 2224/32225* (2013.01); *H01L 2224/48227* (2013.01); *H01L 2224/73265* (2013.01); *H01L 2924/13091* (2013.01)
USPC ........... 257/774; 257/668; 257/701; 257/702; 257/786; 257/E23.011; 361/719; 361/760; 361/777

(58) Field of Classification Search
CPC ........... H01L 2224/32225; H01L 2224/48227; H01L 2224/73265; H01L 2924/00; H01L 2224/16225; H01L 23/49822; H01L 23/49827; H01L 2924/09701; H01L 2924/13091
USPC .......... 257/774, 668, 701, 702, 786, E23.011, 257/E23.067, E23.145, E23.174, E21.577, 257/E21.578; 361/719, 720, 748, 760, 772, 361/774, 777
See application file for complete search history.

(56) References Cited

U.S. PATENT DOCUMENTS

| | | | |
|---|---|---|---|
| 5,179,043 A | | 1/1993 | Weichold et al. |
| 5,662,987 A | * | 9/1997 | Mizumoto et al. ............ 428/209 |
| 6,306,749 B1 | * | 10/2001 | Lin ............................... 438/612 |

(Continued)

OTHER PUBLICATIONS

N. Chandler et al., "Ultra-fine feature printed circuits and multi-chip modules", Microelectronics Journal, vol. 26, Issue 4, May 1995, pp. 393-404.

*Primary Examiner* — Teresa M Arroyo

(57) ABSTRACT

A substrate comprising a plurality of layers, a first side and a second side; and a via extending through the substrate from the first side to the second side. The via comprises: a first substrate via extending through a first layer of the plurality of layers, the first substrate via having a first cross-sectional area; a first capture pad disposed under the first substrate via, wherein the first capture pad physically contacts the first substrate via; a second substrate via extending through a second layer of the plurality of layers, the second substrate via physically contacting the first capture pad, the second substrate via having a second cross-sectional area that is greater than the first cross-sectional area; and a second thermal and electrical contact pad disposed under the second dielectric layer, wherein the second contact pad physically contacts the second substrate via.

27 Claims, 21 Drawing Sheets

(56) References Cited

U.S. PATENT DOCUMENTS

| | | | |
|---|---|---|---|
| 6,316,801 B1* | 11/2001 | Amanuma | 257/306 |
| 6,353,189 B1* | 3/2002 | Shimada et al. | 174/255 |
| 6,603,203 B2* | 8/2003 | Amanuma | 257/758 |
| 6,627,926 B2* | 9/2003 | Hartswick et al. | 257/211 |
| 6,809,348 B1 | 10/2004 | Suzuki et al. | |
| 7,239,002 B2* | 7/2007 | Ohkubo et al. | 257/467 |
| 7,393,782 B2 | 7/2008 | Brintzinger et al. | |
| 2002/0046880 A1* | 4/2002 | Takubo et al. | 174/261 |
| 2003/0030985 A1* | 2/2003 | Sakai | 361/720 |
| 2003/0155642 A1* | 8/2003 | Davis et al. | 257/700 |
| 2004/0124512 A1 | 7/2004 | Tao et al. | |
| 2005/0151241 A1* | 7/2005 | Reddy et al. | 257/703 |
| 2005/0155791 A1* | 7/2005 | Saiki | 174/262 |
| 2007/0018331 A1* | 1/2007 | Chen | 257/774 |
| 2007/0175025 A1* | 8/2007 | Tsukamoto et al. | 29/832 |
| 2008/0190658 A1* | 8/2008 | Toyoda et al. | 174/263 |
| 2008/0191355 A1* | 8/2008 | Park | 257/760 |
| 2008/0211108 A1* | 9/2008 | Hotta et al. | 257/774 |
| 2008/0247226 A1* | 10/2008 | Liu et al. | 365/163 |
| 2010/0171218 A1* | 7/2010 | Aoi | 257/741 |
| 2010/0187679 A1* | 7/2010 | Hayashi et al. | 257/692 |
| 2010/0200992 A1* | 8/2010 | Purushothaman et al. | 257/758 |

* cited by examiner

SUBSTRATE VIAS FOR HEAT REMOVAL FROM SEMICONDUCTOR DIE

BACKGROUND

Packaging of semiconductor devices in die form has lead to the implementation of various techniques to effect electrical connections to the semiconductor devices as well as to effect paths to dissipate heat. Often, the semiconductor devices are mounted over a multi-layer circuit board (MLB). One type of MLB comprises laminated layers of dielectric material with selectively disposed electrical circuit traces at each layer. Another type of MLB comprises a plurality of layers of ceramic material with selectively disposed electrical circuit traces at each layer. The MLB provides a substrate for a chip carrier comprising a plurality of individual die and enables the "fanning out" of input/output connections to the individual die.

Vias can be provided through the MLB to provide electrical connections to the die, and to provide a path for dissipation of heat generated by the die. Vias in the MLB can also be provided to enable selective electrical interconnection between electrical circuit traces on the MLB.

Efficient dissipation of heat improves the thermal performance of the die, which in turn can provide improved or consistent electrical performance of the die. Effective heat removal from the die through the MLB requires an efficient thermal path with low thermal resistance.

One type of via is substantially hollow and is referred to as a "barrel" via. Another type of via is substantially solid and is referred to as a "filled" via. The die can be connected to the via using a contact pad. Typically, the die is connected to a printed wiring board (PWB) using a wire-bond or using a solder bump. The latter connection is often associated with so-called "flip-chip" packaging.

The use of known vias presents limited efficiency in dissipation of heat from die on MLB. This results from an unacceptably high thermal resistance of the thermal path from the die through the MLB. What is needed, therefore, is a MLB with improved thermal dissipation of heat from dies provided over chip-carrier substrates.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

Figure 1:
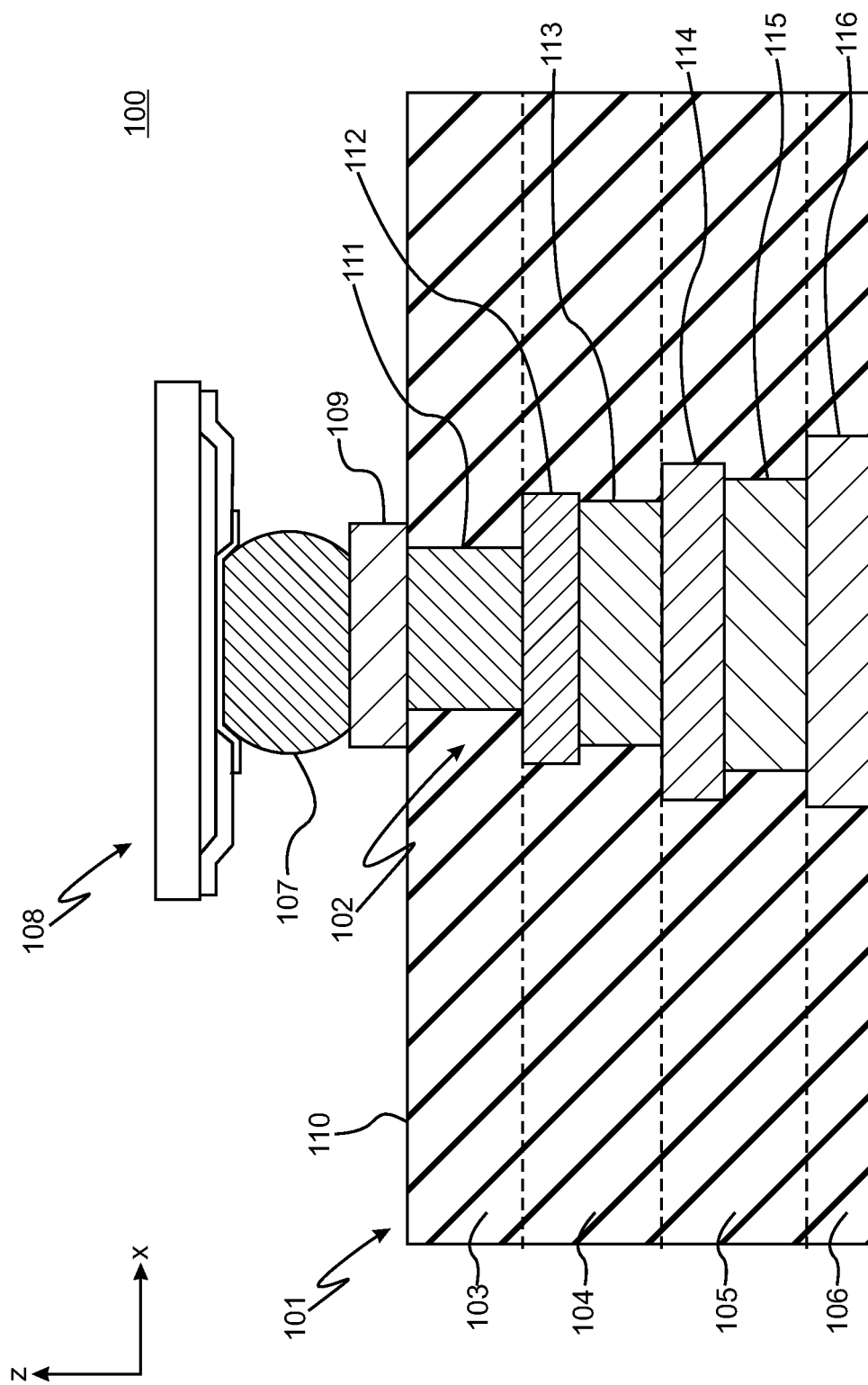
FIG. 1 shows a cross-sectional view of a semiconductor package in accordance with a representative embodiment.

FIG. 1 shows a cross-sectional view of a semiconductor package 100 in accordance with a representative embodiment. The semiconductor package comprises a substrate 101 and a via 102 extending through the substrate 101. The substrate 101 comprises a first layer 103, a second layer 104, a third layer 105 and a fourth layer 106 (sometimes referred to collectively herein as layers 103~106). It is emphasized that the selection of four layers (layers 103~106) is merely illustrative, and that the substrate 101 may comprise more or fewer layers than four. As should be appreciated, the number of layers is selected based on design considerations and input/output requirements. The principles of the substrate 101 and the principles of its fabrication described herein are applicable to more or fewer than four layers (layers 103~106). The via 102 comprises a material selected to provide suitable thermal conductivity. In a representative embodiment, the material may be a thermal electrical conductor such as copper (Cu), silver (Ag), gold (Au) or aluminum (Al), or Tungsten (W) or alloys thereof. It is emphasized that this is merely illustrative and other materials may be used for the via 102. To this end, the via 102 may comprise virtually any metal, and more generally any material that provides sufficiently high thermal conductivity. Finally, in certain representative embodiments, more than one material may be used for the via. For example, the outer portion of the via 102 may comprise one material (e.g., copper) and "filled" with another material (e.g., Al) such as a damascene via structure (not shown).

The layers 103~106 may comprise a dielectric material or a ceramic material. Illustrative materials include, but are not limited to are prepreg, teflon, aluminum oxide, ceramic or glass materials. Depending on the application, a wide range of ceramic materials are contemplated. Some examples include aluminum nitride, aluminum silicate, barium neodymium titanate, barium strontium titanate (BST), barium tantalate, barium titanate (BT), beryllia, boron nitride, calcium titanate, calcium magnesium titanate (CMT), magnesium aluminum silicate, lead zinc niobate (PZN), lithium niobate (LN), magnesium silicate, magnesium titanate, niobium oxide, porcelain, quartz, sapphire, strontium titanate, silica, tantalum oxide, zirconium oxide. Electrical traces (not shown) and passive electrical components (not shown) may be provided between the layers 103~106 to provide selective electrical connections and circuits in the substrate 101.

In the presently described representative embodiment, a solder bump 107 is provided over the substrate 101. The solder bump 107 provides an electrical connection and a thermal conduction path between a semiconductor die 108 and a contact pad 109), which is disposed over a first side 110 of the substrate 101. In such an arrangement, the semiconductor die 108 is "flip-chip" mounted over the substrate 101. The semiconductor die 108 illustratively comprises an active semiconductor device (not shown), and may comprise passive electrical components (not shown) and circuit traces (not shown). The active semiconductor device is fabricated from a semiconductor material. Illustrative semiconductor materials for the active semiconductor device include binary semiconductor materials (e.g., Group III-IV and Group IV-VI semiconductor materials), ternary semiconductor materials, silicon (Si) and silicon-germanium (SiGe). Moreover, the present teachings contemplate the use of synthetic diamond fabricated by a known chemical vapor deposition (CVD) method.

Illustratively, the active semiconductor device of the semiconductor die 108 is a heterojunction bipolar transistor (HBT). It is emphasized that the selection of GaAs for the semiconductor material and the selection of the HBT device are merely illustrative, and other semiconductor materials and active devices (electronic and optoelectronic) are contemplated. Illustratively, the active device may be a pseudomorphic high electron mobility transistor (pHEMT). Alternatively, the semiconductor material may comprise silicon and the active device may comprise a metal oxide semiconductor (MOS) device such as a MOS field effect transistor (MOSFET) or complementary MOS (CMOS) device. Additionally, the semiconductor die 108 may comprise a combination of a plurality of the different active semiconductor devices to provide a desired circuit. Furthermore, the active devices of the semiconductor die 108 may provide power amplifiers and other devices that require heat dissipation. While such power devices are illustrative, other active semiconductor devices that do not require the same degree of heat dissipation as power devices (e.g., power amplifiers) are contemplated to be included in the semiconductor die 108.

The via 102 comprises a first substrate via 111 that extends through the first layer 103. The first substrate via 111 is connected to the contact pad 109 and to a first capture pad 112. The first capture pad 112 is disposed over the first layer 103. Notably, the boundary of the first layer 103 and the second layer 104 is distinguished in the drawing with a dashed-line as shown in FIG. 1.

The first capture pad 112 has a first cross-sectional area (where the areal dimension is in the x-y plane in the coordinate system shown in FIG. 1). Moreover, the first substrate via 111 has a first cross-sectional areal dimension (where the areal dimension is in the x-y plane in the coordinate system shown in FIG. 1). In a representative embodiment, the first capture pad 112 and the first substrate via 111 have a somewhat elliptical shape (shown and described below in connection with FIG. 2) over their respective areal dimensions. It is emphasized that this is merely illustrative and that the first capture pad 112 and the first substrate via 111 may have a substantially elliptical shape, a substantially circular shape, a substantially rectangular shape, a substantially square shape, a substantially parallelogram shape, another substantially geometrical shape, or an irregular shape.

The via 102 further comprises a second substrate via 113 that extends through the second layer 104. The second substrate via 113 is connected to the first capture pad 112 and to a second capture pad 114. The second capture pad 114 is disposed under the second layer 104. Notably, the boundary of the second layer 104 and the third layer 105 is distinguished in the drawing with a dashed-line as shown in FIG. 1.

The second capture pad 114 has a second cross-sectional area (where the areal dimension is in the x-y plane in the coordinate system shown in FIG. 1). Moreover, the second substrate via 113 has a second cross-sectional areal dimension (where the areal dimension is in the x-y plane in the coordinate system shown in FIG. 1). In a representative embodiment, the second capture pad 114 and the second substrate via 113 have a somewhat elliptical shape (shown and described below in connection with FIG. 3) over their respective areal dimensions. It is emphasized that this is merely illustrative and that the second capture pad 114 and the second substrate via 113 may have a substantially elliptical shape, a substantially circular shape, a substantially rectangular shape, a substantially square shape, a substantially parallelogram shape, another substantially geometrical shape, or an irregular shape. Generally, the shape of the second capture pad 114 and the second substrate via 113 are substantially the same and substantially the same as the shape of the first capture pad 112 and the first substrate via 111. However, in the representative embodiment shown in FIG. 1, the second cross-sectional area (of the second capture pad 114) is greater than the first cross-sectional area (of the first capture pad 112). Additionally, in the representative embodiment shown in FIG. 1, the second cross-sectional areal dimension (of the second substrate via 113) is greater than the first cross-sectional areal dimension (of the first substrate via 111), but is less than the second cross-sectional area of the first capture pad 112, over which the second substrate via 113 is formed.

The via 102 further comprises a third substrate via 115 that extends through the third layer 105. The third substrate via 115 is connected to the second capture pad 114 and to a third capture pad 116. The third capture pad 116 is disposed under the third layer 105. Notably, the boundary of the third layer 105 and the fourth layer 106 is distinguished in the drawing with a dashed-line as shown in FIG. 1.

The third capture pad 116 has a third cross-sectional area (where the areal dimension is in the x-y plane in the coordinate system shown in FIG. 1). Moreover, the third substrate via 115 has a third cross-sectional areal dimension (where the areal dimension is in the x-y plane in the coordinate system shown in FIG. 1). In a representative embodiment, the third capture pad 116 and the third substrate via 115 have a somewhat elliptical shape (shown and described below in connection with FIG. 2) over their respective areal dimensions. It is emphasized that this is merely illustrative and that the third capture pad 116 and the third substrate via 115 may have a substantially elliptical shape, a substantially circular shape, a substantially rectangular shape, a substantially square shape, a substantially parallelogram shape, another substantially geometrical shape, or an irregular shape. Generally, the shape of the third capture pad 116 and the third substrate via 115 are substantially the same and substantially the same as the shape of the first capture pad 112 and the first substrate via 111. However, in the representative embodiment shown in FIG. 1, the third cross-sectional area (of the third capture pad 116) is greater than the second cross-sectional area (of the second capture pad 114). Additionally, in the representative embodiment shown in FIG. 1, the third cross-sectional areal dimension (of the third substrate via 115) is greater than the second cross-sectional areal dimension (of the second substrate via 113), but is less than the second cross-sectional area (of the second capture pad 114), over which the third substrate via 115 is formed. Finally, it is noted that the 'trapezoidal shape of the via 102 is not necessarily symmetric about any axis of the coordinate system shown, and the successively increasing areal dimensions of the substrate vias 111, 113, 115 and the first, second and third capture pads 112, 114, 116 can but do not necessarily follow a pattern.

As should be appreciated, in the representative embodiment, the via 102 comprises substrate vias 111, 113, 115, which have successively increasing surface areas (again with the areal dimension being in the x-y plane according to the coordinate system shown in FIG. 1). This provides the via 102 with a somewhat overall "trapezoidal" shape with increasing areal dimension between the first side 110 and a second side 117 of the substrate 101. This trapezoidal shape of the thermally and electrically conductive via 102 fosters dissipation of heat emanating from the semiconductor die 108 through the solder bump 107 as the heat tends to flow over a volume that can be represented by a trapezoid. As such, along its flow from the semiconductor die 108, the heat follows the shape of the via 102.

In the embodiments described in connection with FIG. 1, each successive substrate via 111, 113, 115 is beneficially greater in cross-sectional area (again where the areal dimension is in the x-y plane in the coordinate system shown in FIG. 1) than the previous respective substrate via 111, 113, 115 over which it is formed. This provides the somewhat trapezoidal shape of the via 102. As described more fully below, the somewhat "step-wise" nature of the trapezoidal shape results from the limitations of known photolithographic methods used to fabricate the substrate 101. This "step-wise" nature of the trapezoidal shape of the via 102 is not essential, and more "smooth" transitions, and thus a truer trapezoidal shape for the via 102 are contemplated as fabrication technologies advance or if other fabrication technologies within the purview of one of ordinary skill in the art are implemented in the fabrication of the substrate 101. Finally, it is noted that the successive increases in the cross-sectional areas of the substrate vias 111, 113, 115 described above, while beneficial, is not essential. Rather, one or more of the successive substrate vias 111, 113, 115 of the via 102 can be substantially the same in cross-sectional area as the previous substrate via or capture pad, or both. By way of example only, the present teachings contemplate, for example, that the third capture pad 116, the third substrate via 115 and the second capture pad 114 all have substantially the same areal dimensions (in the x-y plane according to the coordinate system shown in FIG. 1); and that this areal dimension is greater than the areal dimensions of the second substrate via 113 and the first capture pad 112.

Finally, it is noted that a contact pad (not shown) may be provided over the third substrate via 115 and over the second side 117 of the substrate 101. Alternatively, the third substrate via 115 may extend beyond the second side 117, and thus not be substantially flush therewith as is depicted in FIG. 1.

Figure 2:
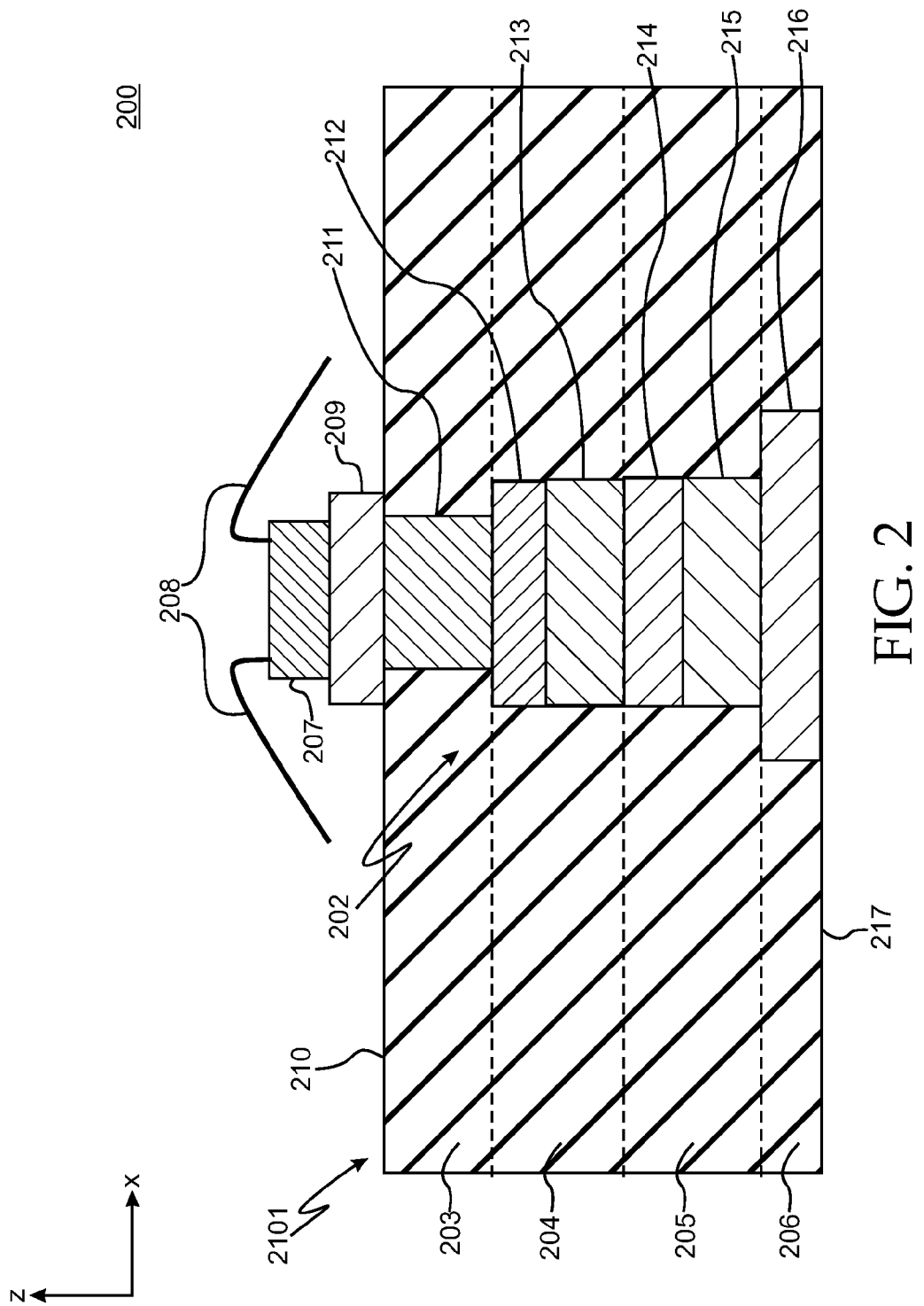
FIG. 2 shows a cross-sectional view of a semiconductor package in accordance with a representative embodiment.

FIG. 2 shows a cross-sectional view of a semiconductor package 200 in accordance with a representative embodiment. The semiconductor package comprises a substrate 201 and a via 202 extending through the substrate 201. The substrate 201 comprises a first layer 203, a second layer 204, a third layer 205 and a fourth layer 206 (sometimes referred to collectively herein as layers 203~206). It is again emphasized that the selection of four layers (layers 203~206) is merely illustrative, and that the substrate 201 may comprise more or fewer layers than four. As should be appreciated, the number of layers is selected based on design considerations and input/output requirements. The principles of the substrate 201 and the principles of its fabrication described herein are applicable to more or fewer than four layers (layers 203~206). The via 202 comprises a material selected to provide suitable thermal conductivity such as the materials described above in connection with the representative embodiments of FIG. 1. It is emphasized that this is merely illustrative and other materials may be used for the via 202. The layers 203~206 may comprise a dielectric material or a ceramic material such as those described above in connection with the representative embodiments of FIG. 1. Electrical traces (not shown) and passive electrical components (not shown) may be provided between the layers 203~206 to provide selective electrical connections and circuits in the substrate 201.

In the presently described representative embodiment, a semiconductor die 208 is provided over a contact pad 209), with electrical connections to the semiconductor die 208 being effected by wire bonds 207. These electrical connections are made to other circuits (not shown). In such an arrangement, the semiconductor die 208 is "wire-bond" mounted over the substrate 201. The contact pad 209 provides an electrical connection and a thermal conduction path between a semiconductor die 208 and the via 202. The semiconductor die 208 illustratively comprises an active semiconductor device (not shown), and may comprise passive electrical components (not shown) and circuit traces (not shown). The active semiconductor device is fabricated from a semiconductor material. Illustrative semiconductor materials for the active semiconductor device include binary semiconductor materials (e.g., Group III-IV and Group IV-VI semiconductor materials), ternary semiconductor materials, silicon (Si) and silicon-germanium (SiGe). Moreover, the present teachings contemplate the use of synthetic diamond fabricated by a known chemical vapor deposition (CVD) method.

Illustratively, the active semiconductor device of the semiconductor die 208 is a heterojunction bipolar transistor (HBT). It is emphasized that the selection of GaAs for the semiconductor material and the selection of the HBT device are merely illustrative, and other semiconductor materials and active devices (electronic and optoelectronic) are contemplated. Illustratively, the active device may be a pseudomorphic high electron mobility transistor (pHEMT). Alternatively, the semiconductor material may comprise silicon and the active device may comprise a metal oxide semiconductor (MOS) device such as a MOS field effect transistor (MOSFET) or complementary MOS (CMOS) device. Additionally, the semiconductor die 208 may comprise a combination of a plurality of the different active semiconductor devices to provide a desired circuit. Furthermore, the active devices of the semiconductor die 208 may provide power amplifiers and other devices that require heat dissipation. While such power devices are illustrative, other active semiconductor devices that do not require the same degree of heat dissipation as power devices (e.g., power amplifiers) are contemplated to be included in the semiconductor die 208.

The via 202 comprises a first substrate via 211 that extends through the first layer 203. The first substrate via 211 is connected to the contact pad 209 and to a first capture pad 212. The first capture pad 212 is disposed over the first layer 203. Notably, the boundary of the first layer 203 and the second layer 204 is distinguished in the drawing with a dashed-line as shown in FIG. 2.

The first capture pad 212 has a first cross-sectional area (where the areal dimension is in the x-y plane in the coordinate system shown in FIG. 2). Moreover, the first substrate via 211 has a first cross-sectional areal dimension (where the areal dimension is in the x-y plane in the coordinate system shown in FIG. 2). In a representative embodiment, the first capture pad 212 and the first substrate via 211 have a somewhat elliptical shape (shown and described below in connection with FIG. 3) over their respective areal dimensions. It is emphasized that this is merely illustrative and that the first capture pad 212 and the first substrate via 211 may have a substantially elliptical shape, a substantially circular shape, a substantially rectangular shape, a substantially square shape, a substantially parallelogram shape, another substantially geometrical shape, or an irregular shape.

The via 202 further comprises a second substrate via 213 that extends through the second layer 204. The second substrate via 213 is connected to the first capture pad 212 and to a second capture pad 214. The second capture pad 214 is disposed over the second layer 204. Notably, the boundary of the second layer 204 and the third layer 205 is distinguished in the drawing with a dashed-line as shown in FIG. 2.

The second capture pad 214 has a second cross-sectional area (where the areal dimension is in the x-y plane in the coordinate system shown in FIG. 2). Moreover, the second substrate via 213 has a second cross-sectional areal dimension (where the areal dimension is in the x-y plane in the coordinate system shown in FIG. 2). In a representative embodiment, the second capture pad 214 and the second substrate via 213 have a somewhat elliptical shape (shown and described below in connection with FIG. 3) over their respective areal dimensions. It is emphasized that this is merely illustrative and that the second capture pad 214 and the second substrate via 213 may have a substantially elliptical shape, a substantially circular shape, a substantially rectangular shape, a substantially square shape, a substantially parallelogram shape, another substantially geometrical shape, or an irregular shape. Generally, the shape of the second capture pad 214 and the second substrate via 213 are substantially the same and substantially the same as the shape of the first capture pad 212 and the first substrate via 211. In the representative embodiment shown in FIG. 2, cross-sectional areas (again where the areal dimension is in the x-y dimension according to the coordinate system shown in FIG. 2) the second capture pad 214, the second substrate via 213 and the first capture pad 212 are substantially identical. Thus, there is no increase in the areal dimension from the first capture pad 212, the second substrate via 213 and the second capture pad 214; and the cross-sectional areas of the first capture pad 212, the second substrate via 213 and the second capture pad 214 are substantially identical but greater than the cross-sectional area of the first substrate via 211. It is emphasized that maintaining the areal dimensions of the first capture pad 212, the second substrate via 213 and the second capture pad 214 substantially the same is merely illustrative. Alternatively, the cross-sectional areas of the first capture pad 212, the second substrate via 213 and the second capture pad may be successively greater, such as described above in connection with the embodiments of FIG. 1.

The via 202 further comprises a third substrate via 215 that extends through the third layer 205. The third substrate via 215 is connected to the second capture pad 214 and to a third capture pad 216. The third capture pad 216 is disposed over the third layer 205. Notably, the boundary of the third layer 205 and the fourth layer 206 is distinguished in the drawing with a dashed-line as shown in FIG. 2. In the representative embodiment, the third capture pad 216 has a cross-sectional area (again where the areal dimension is in the x-y dimension of the coordinate system of FIG. 2) that is greater than the cross-sectional area of the third substrate via 215.

The via 202 has a somewhat overall "trapezoidal" shape with increasing areal dimension between the first side 210 and a second side 217 of the substrate 201. As noted above, this trapezoidal shape of the thermally and electrically conductive via 202 fosters dissipation of heat emanating from the semiconductor die 208 through the contact pad 209 as the heat tends to flow over a volume that can be represented by a trapezoid. As such, along its flow from the semiconductor die 208, the heat follows the shape of the via 202.

As noted above, the somewhat "step-wise" nature of the trapezoidal shape of via 202 results from the limitations of known photolithographic methods used to fabricate the substrate 201. This "step-wise" nature of the trapezoidal shape of the via 202 is not essential, and more "smooth" transitions, and thus a truer trapezoidal shape for the via 202 are contemplated as fabrication technologies advance or if other fabrication technologies within the purview of one of ordinary skill in the art are implemented in the fabrication of the substrate 201.

Finally, it is noted that a contact pad (not shown) may be provided over the third substrate via 215 and over the second side 217 of the substrate 201. Alternatively, the third substrate via 215 may extend beyond the second side 217, and thus not be substantially flush therewith as is depicted in FIG. 2.

Figure 3:
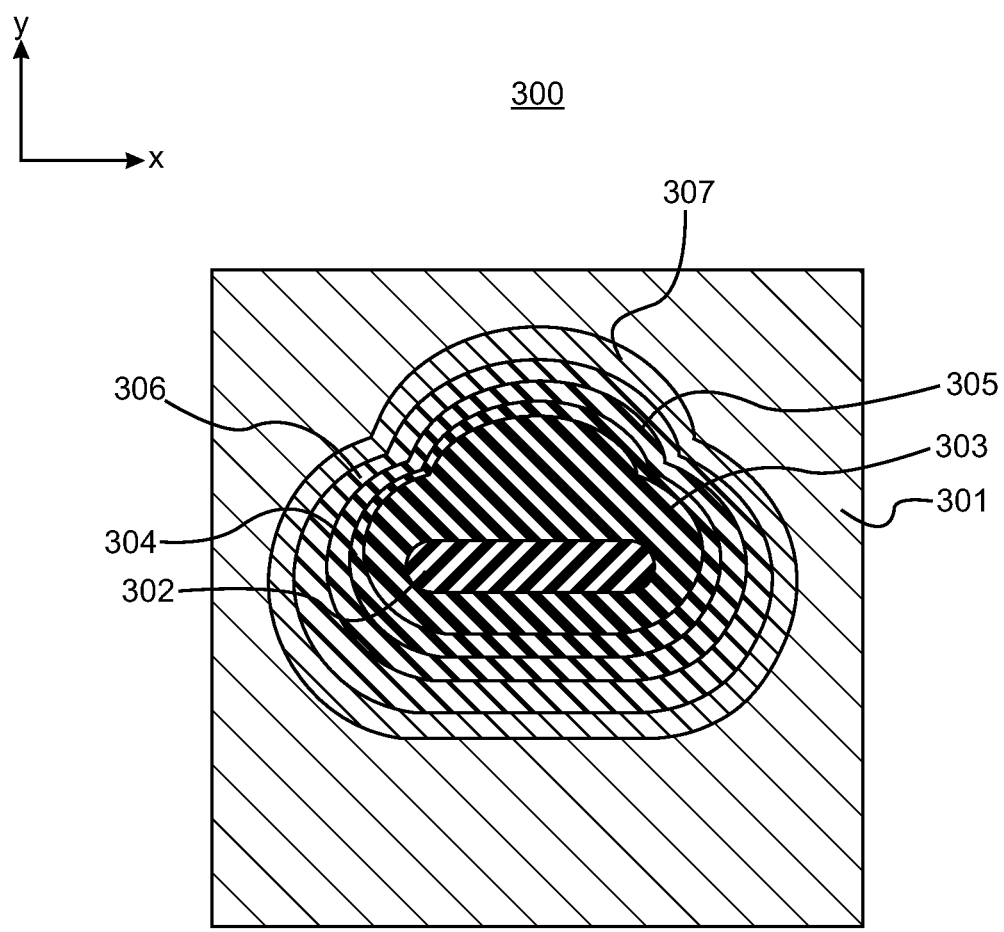
FIG. 3 shows a top view of a portion of a substrate in accordance with a representative embodiment.

FIG. 3 shows a top view of a portion of a substrate 300 in accordance with a representative embodiment. The substrate 300 is representative of an x-ray image through various levels of the substrate 300. Many of the details of the substrate 300 are common to the substrates of the representative embodiments described above in connection with FIGS. 1 and 2. Many of these common details are not repeated in order to avoid obscuring the presently described representative embodiment.

The substrate 300 comprises a first side 301 and a second side (not shown in FIG. 3). A contact pad 302 is provided over the first side 301. A first capture pad 303 is beneath the contact pad 302 and a first substrate via (not shown) forms a connection between the contact pad 302 and the first capture pad 303. A second capture pad 304 is beneath the first capture pad 303 and a second substrate via (not shown) forms a connection between the second capture pad and a third capture pad 305. In the representative embodiment, the second capture pad 304 has a greater areal dimension (in the x-y plane of FIG. 3) than an areal dimension of the first capture pad 303. The third capture pad 305 is beneath the second capture pad 304 and the second substrate via (not shown). The third capture pad 305 and the second substrate via each has a greater areal dimension (in the x-y plane of FIG. 3) than an areal dimension of the first capture pad 303 and the first substrate via. A fourth capture pad 306 is beneath the third capture pad 305 and a third substrate via (not shown) forms a connection between the third capture pad 305 the fourth capture pad 306. The fourth capture pad 306 and the third substrate via each has a greater areal dimension (in the x-y plane of FIG. 3) than an areal dimension of the third capture pad 305 and the second substrate via. A fifth capture pad 307 is beneath the fourth capture pad 306 and a fourth substrate via (not shown) forms a connection between the fourth capture pad 306 and the fourth substrate via.

As should be appreciated, the areal dimensions of the capture pads and substrate vias successively increases between the contact pad 302 and the fifth capture pad, providing a "trapezoidal" via structure. Moreover, the shape of the first, second and third capture pads 303-306 is irregular, but may be elliptical in cross-section (in the x-y plane of FIG. 3), or another cross-sectional shape as noted above.

Figure 4A:
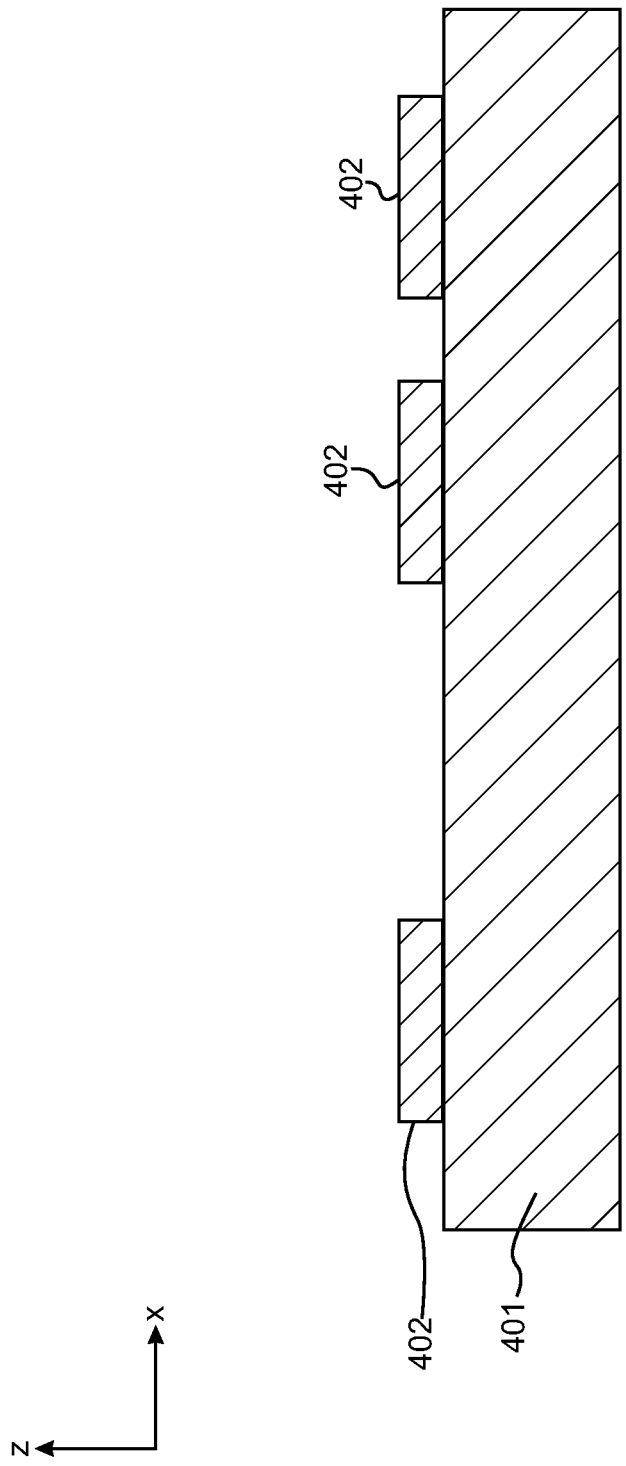
FIGS. 4A-4O show cross-sectional views of fabricating a semiconductor in accordance with a representative embodiment.
Figure 4B:
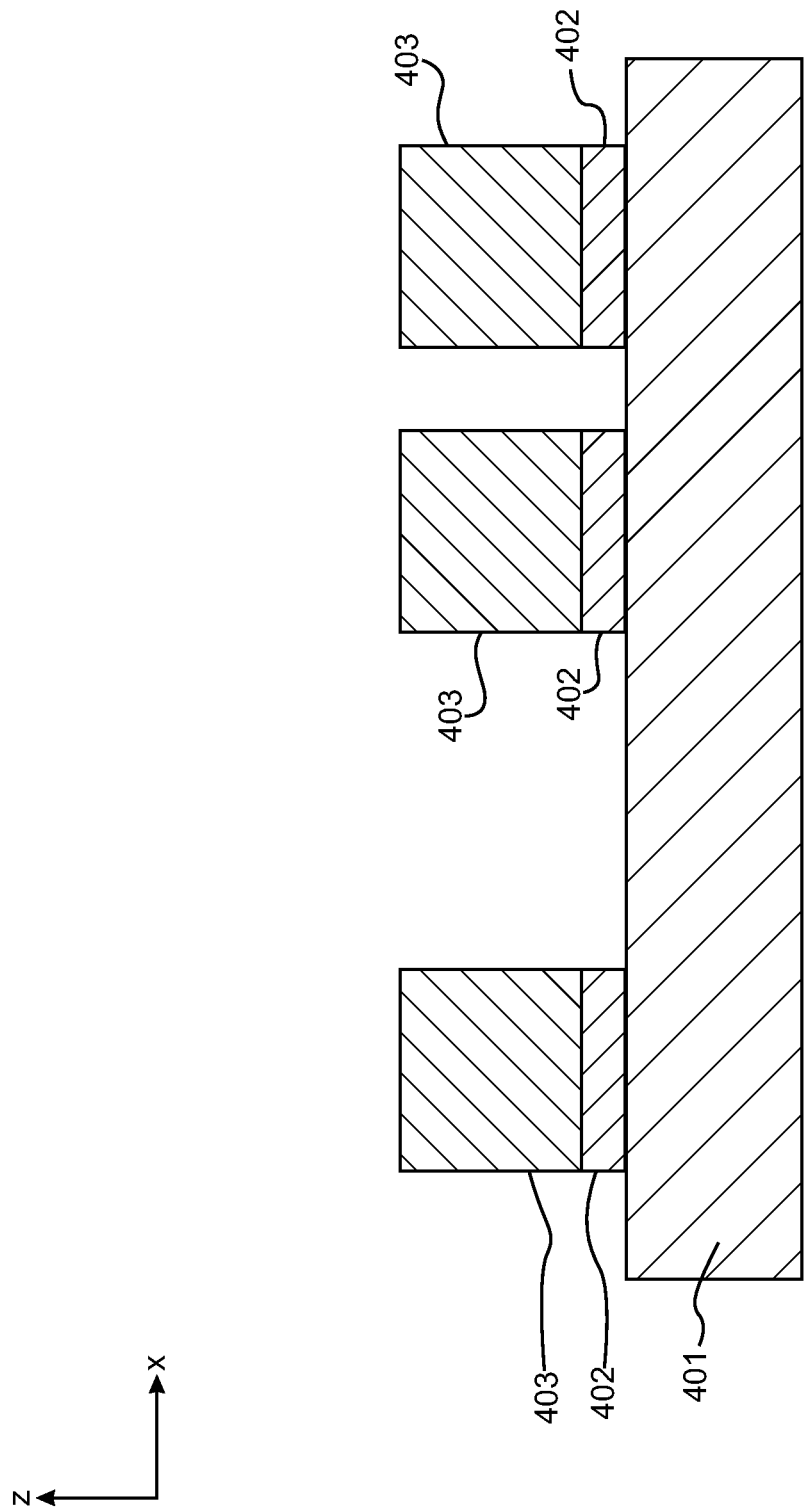
Figure 4C:
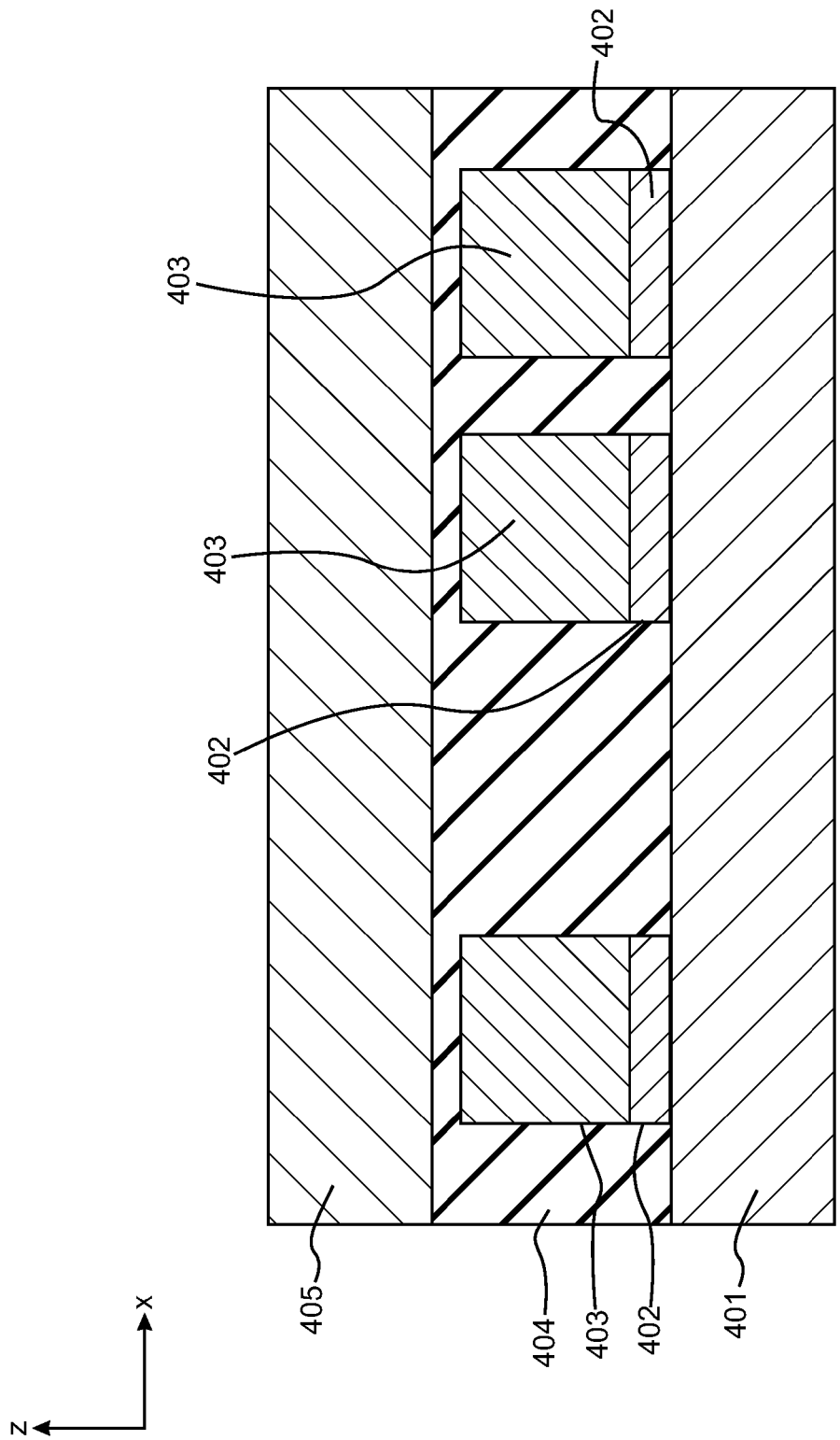
Figure 4D:
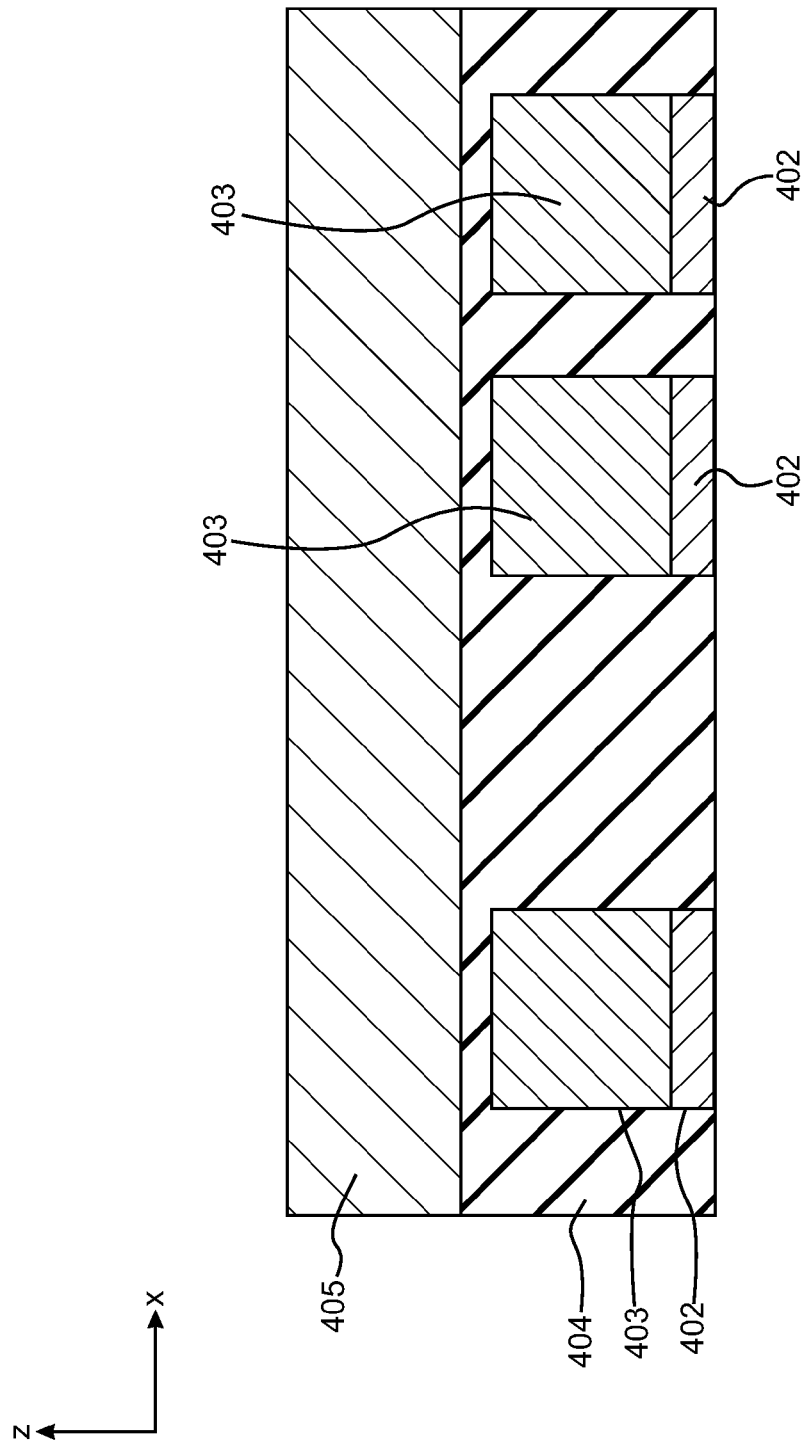
Figure 4E:
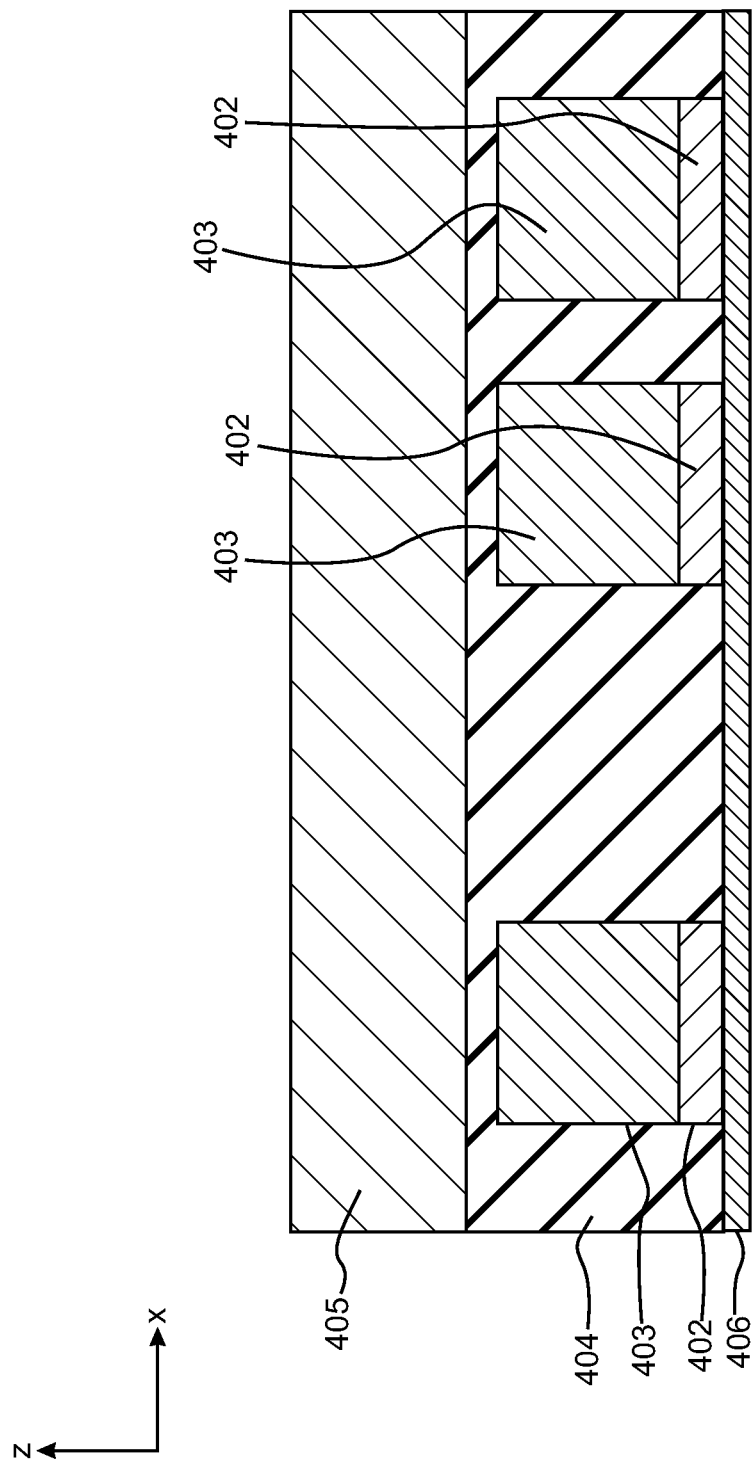
Figure 4F:
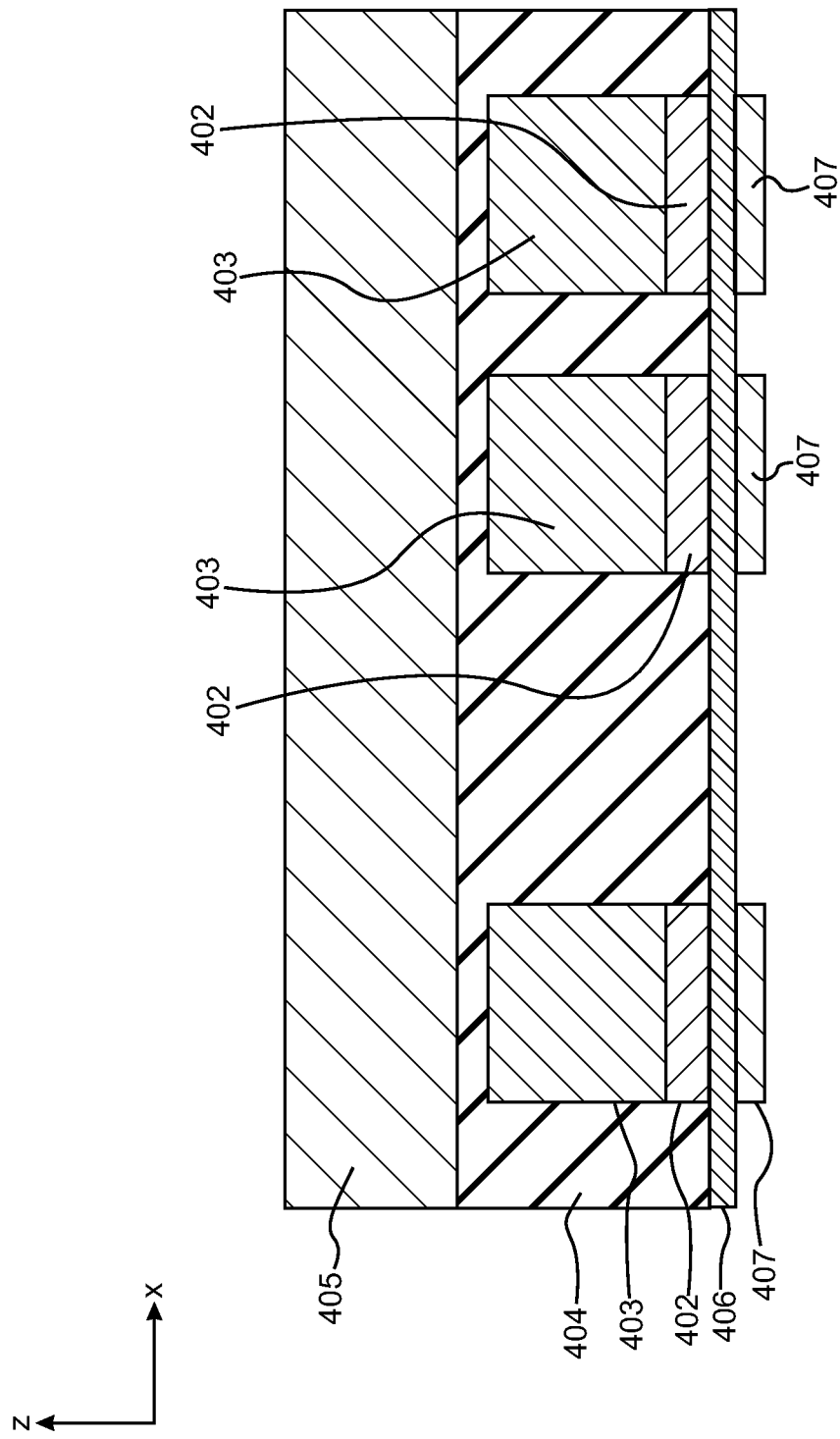
Figure 4G:
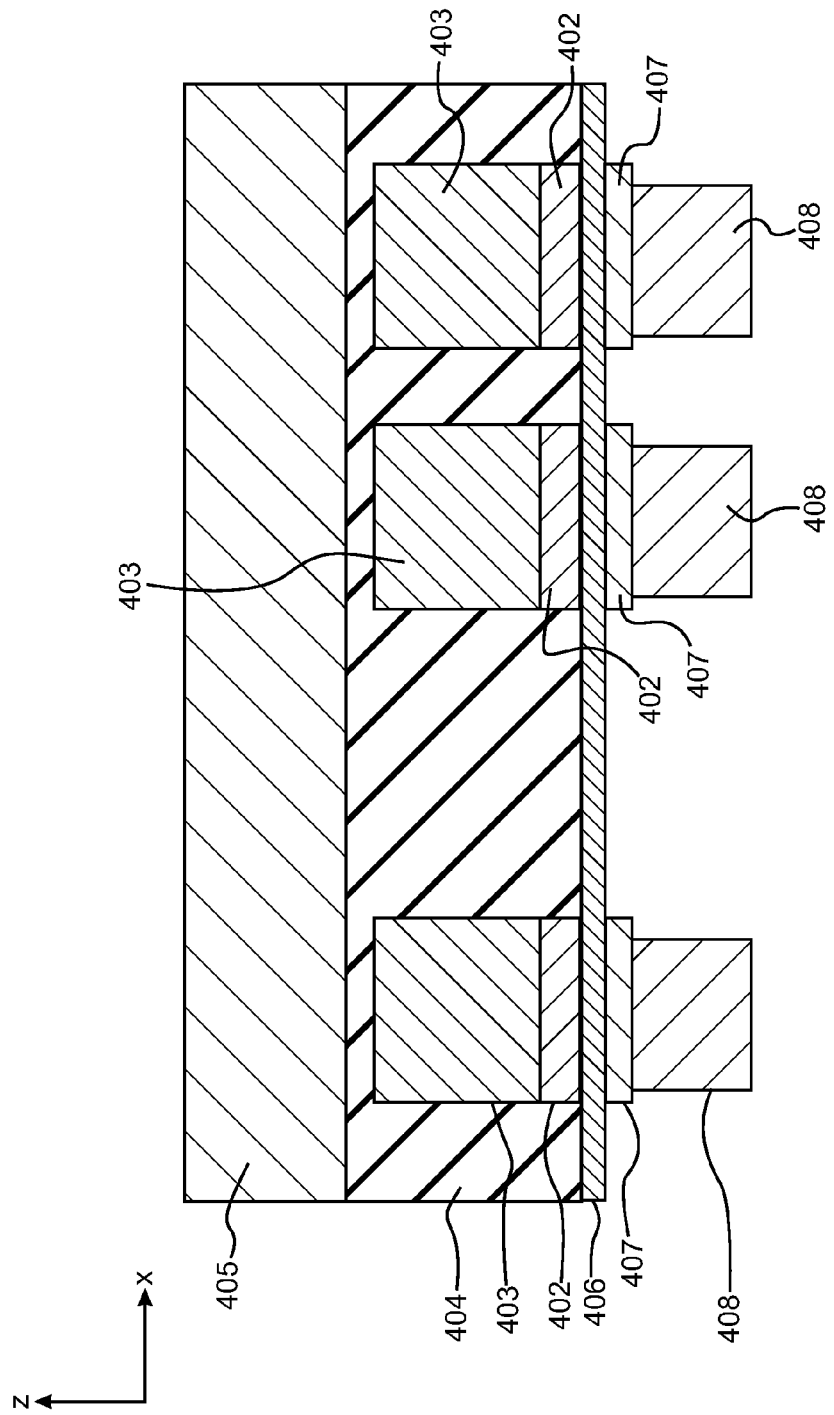
Figure 4H:
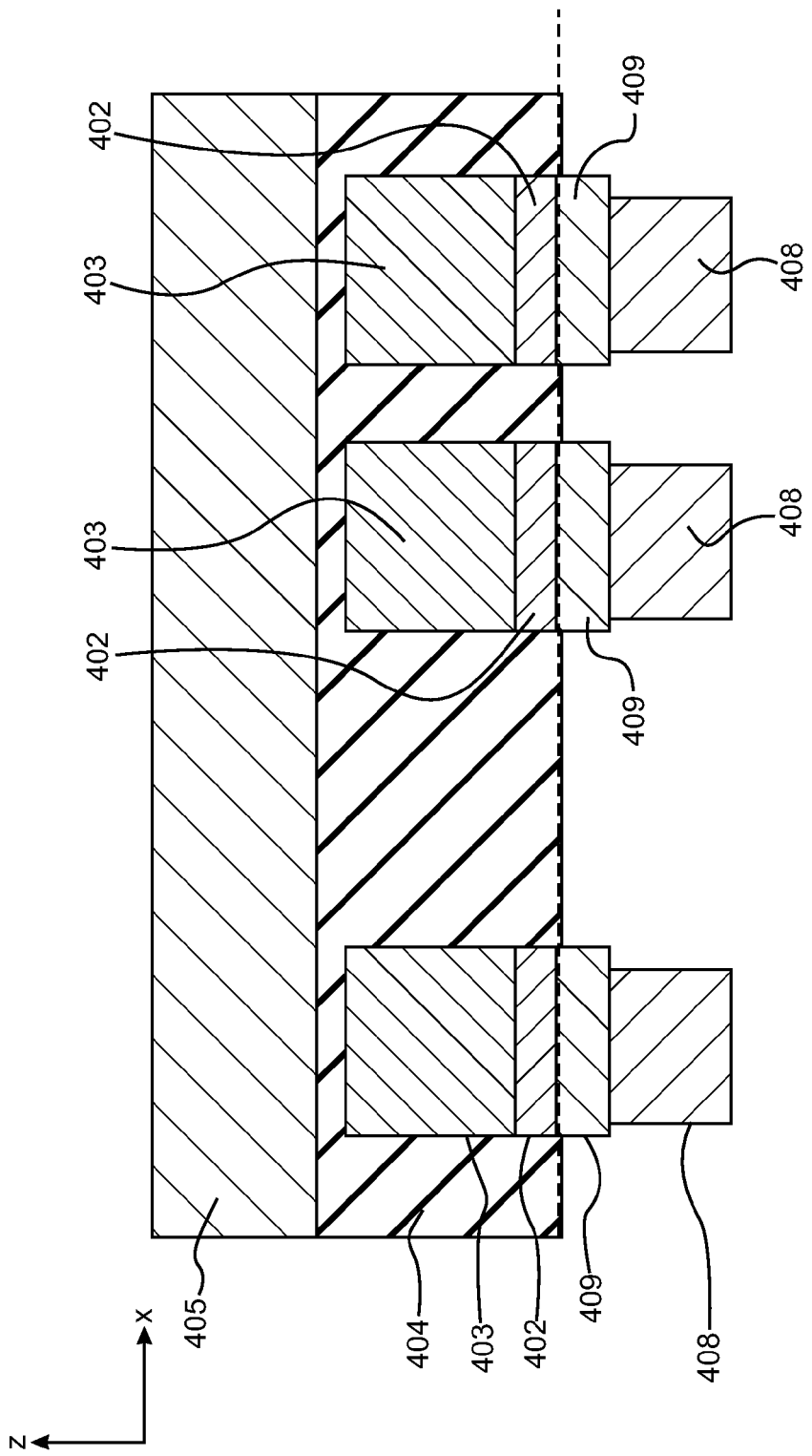
Figure 4I:
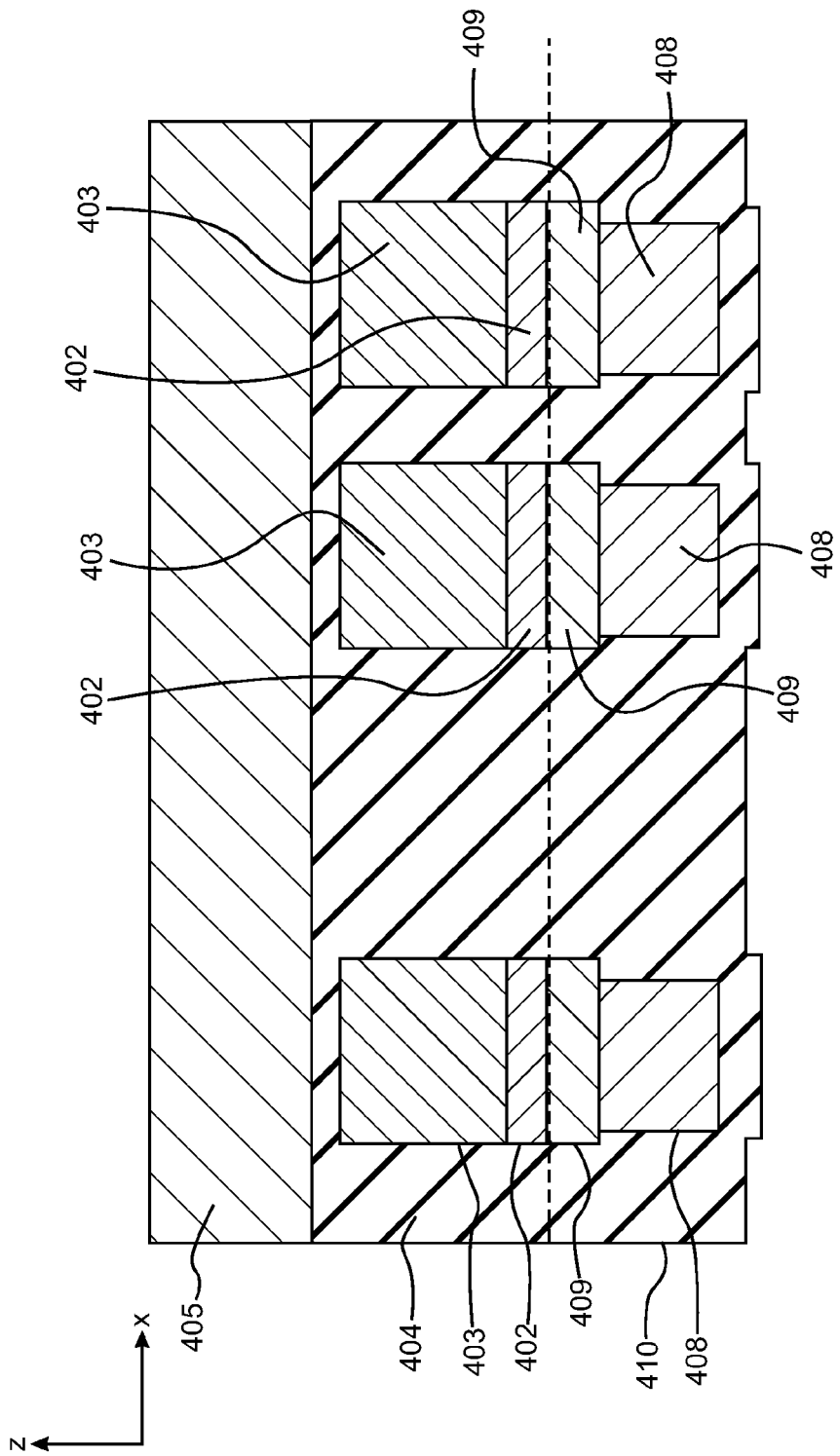
Figure 4J:
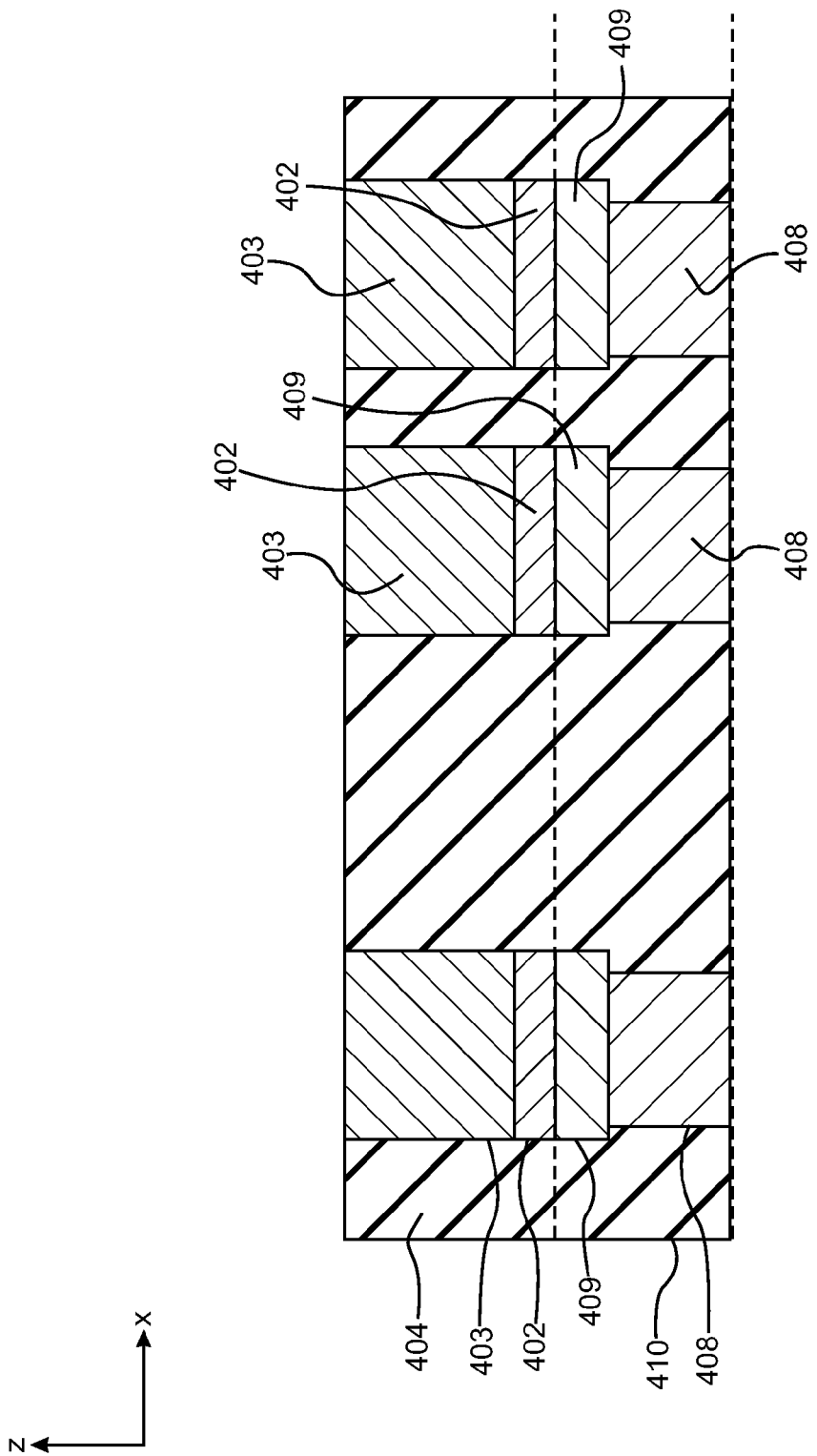
Figure 4K:
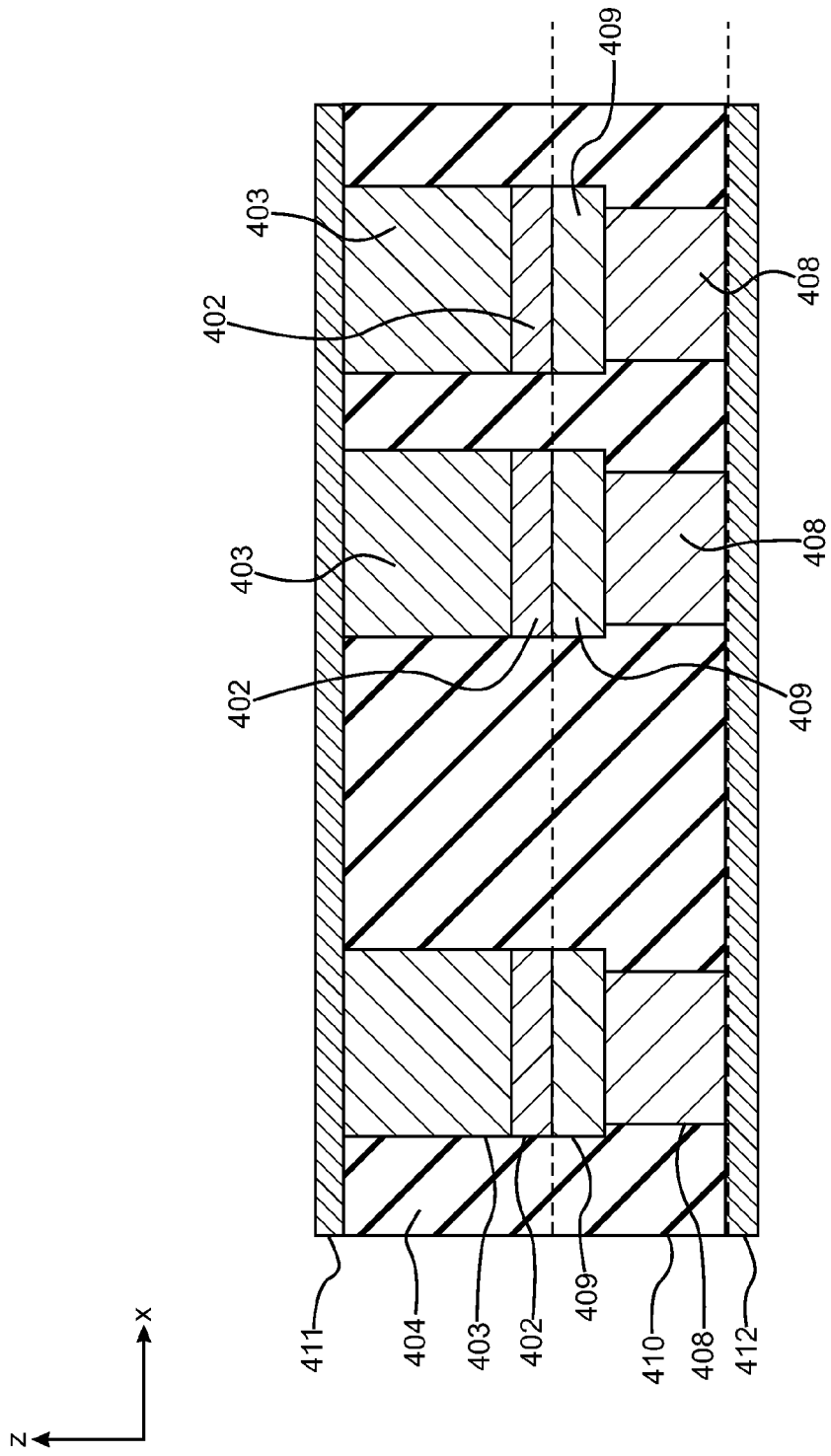
Figure 4L:
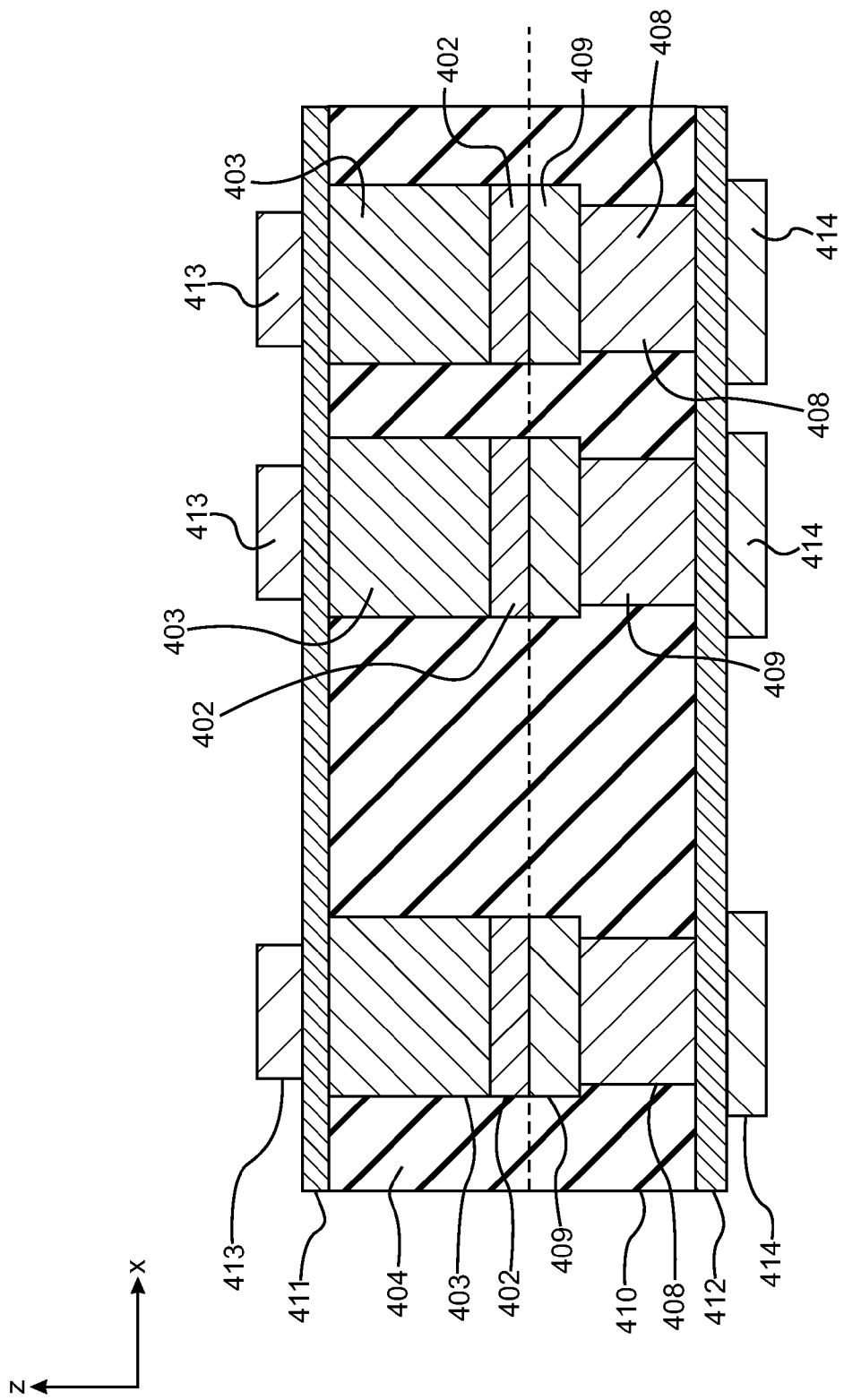
Figure 4M:
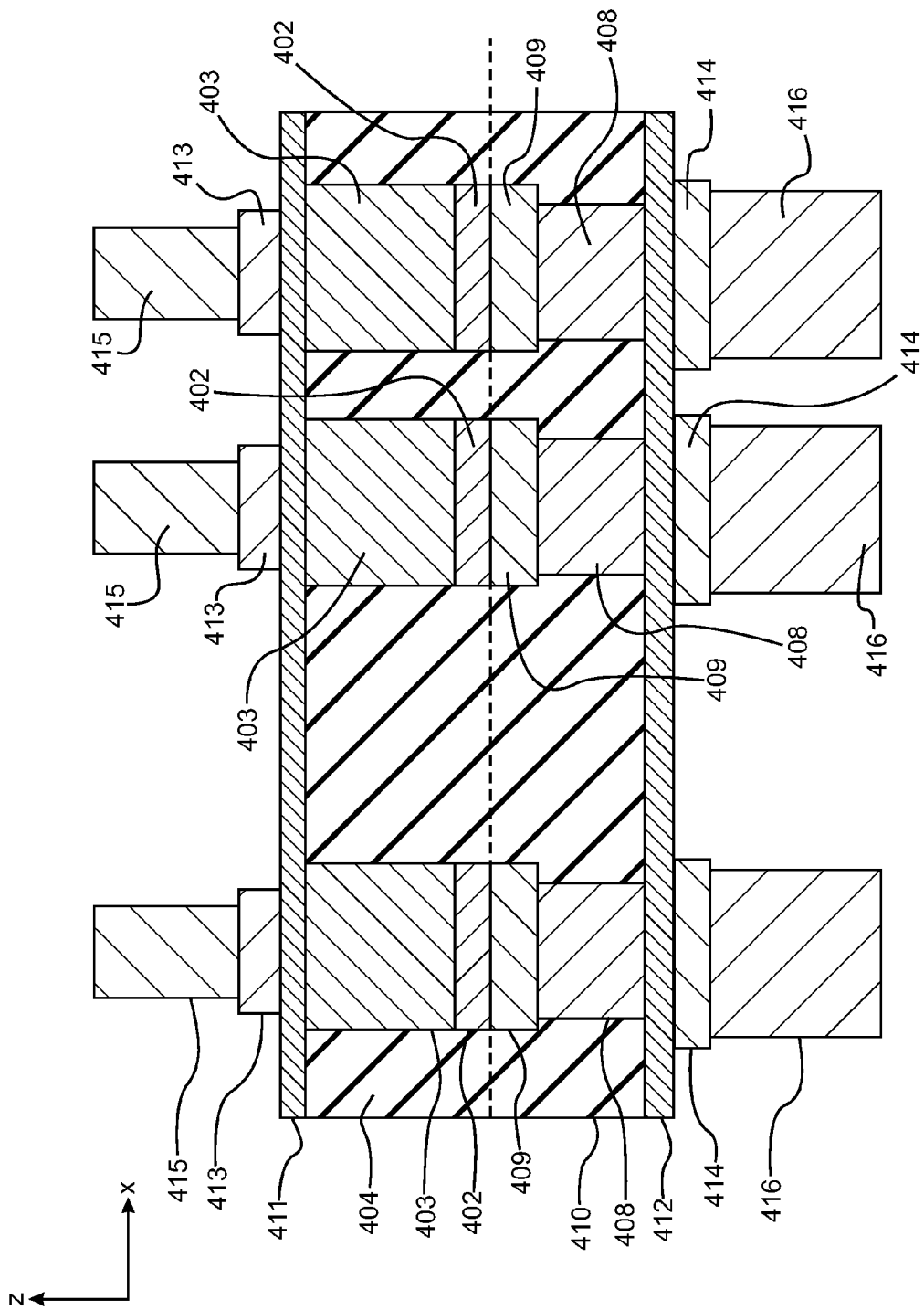
Figure 4N:
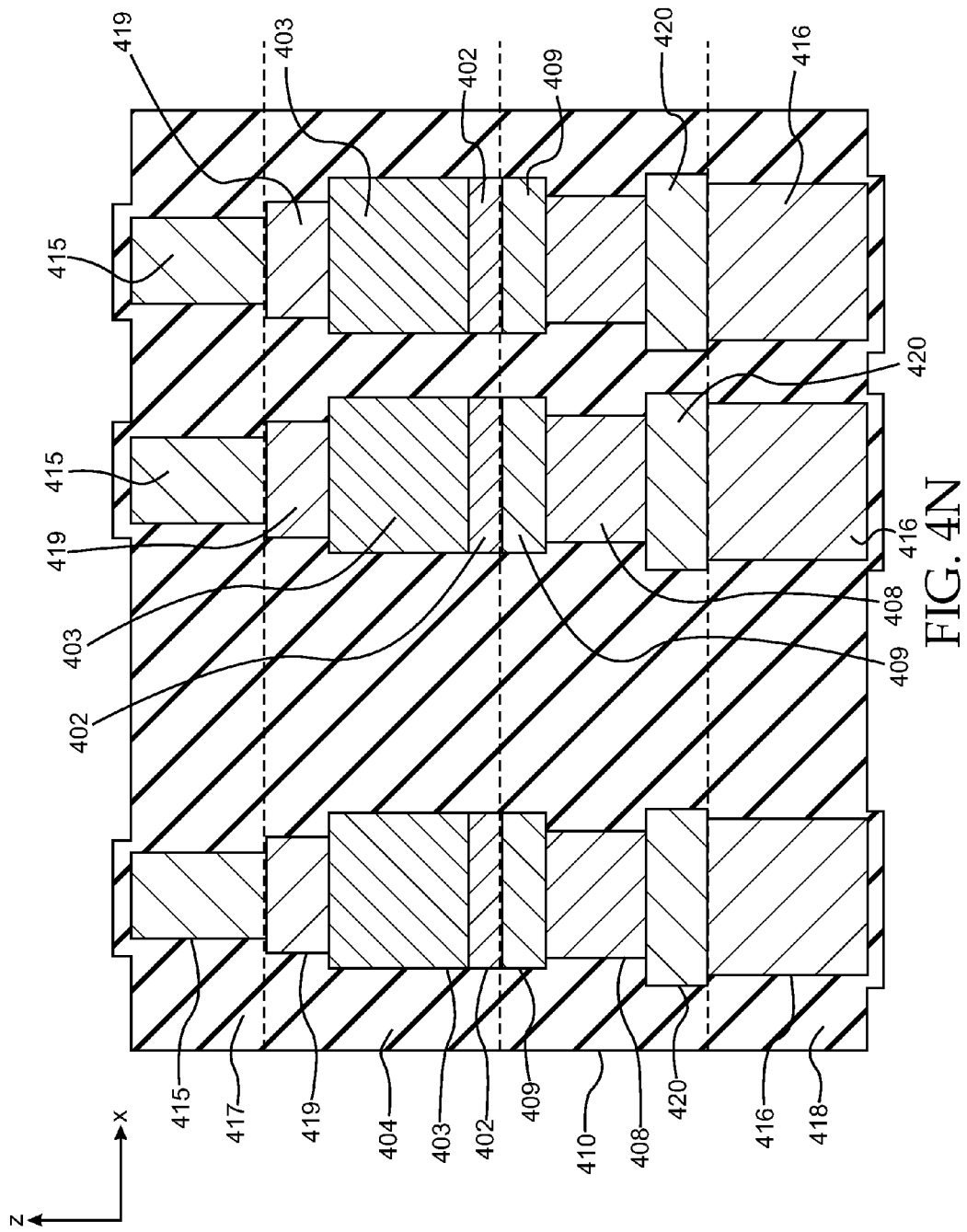
Figure 4O:
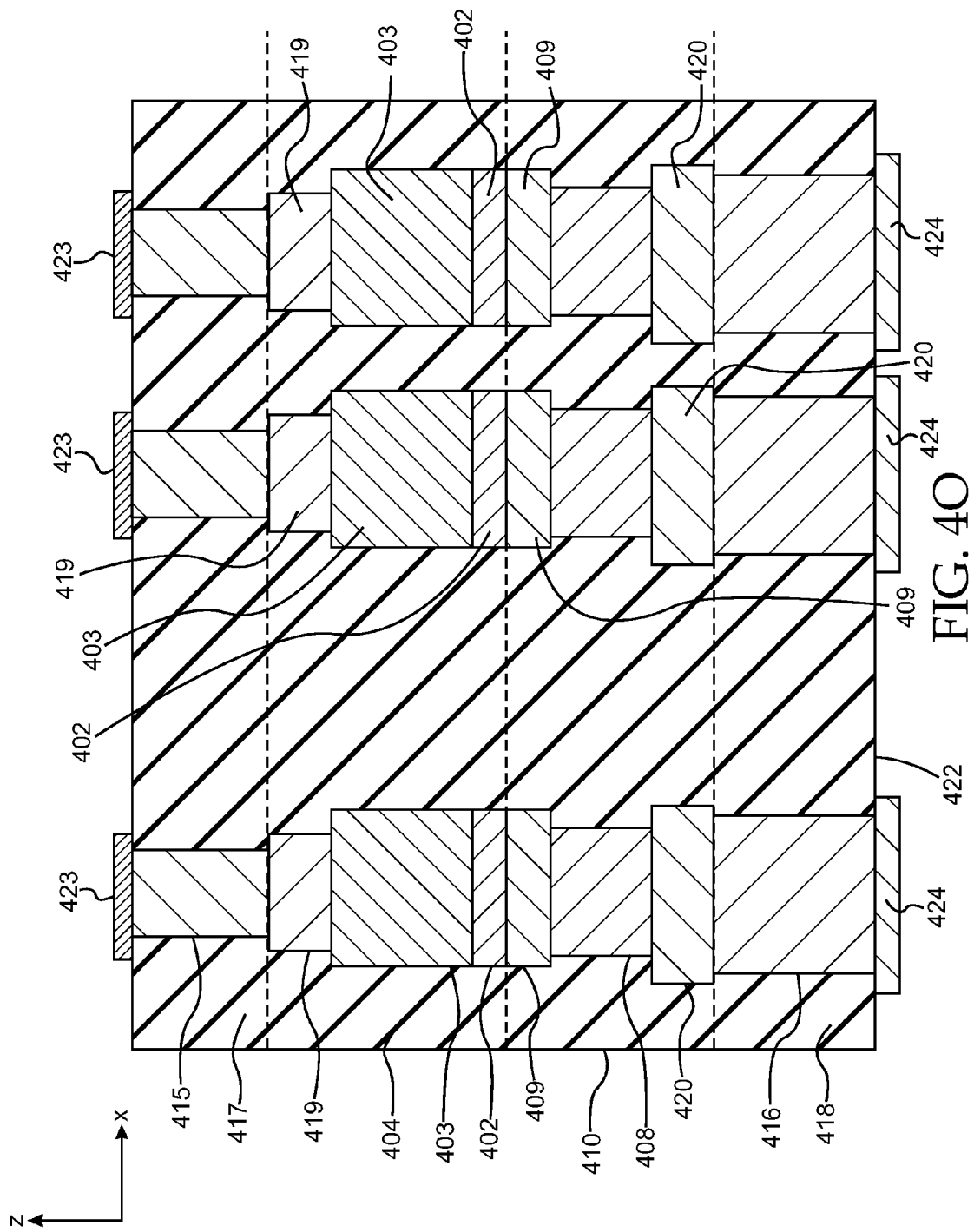

FIGS. 4A-4O show cross-sectional views of fabricating a semiconductor package in accordance with a representative embodiment. The method described in connection with FIGS. 4A-4O may be used to fabricate the substrates 101, 201 and the semiconductor packages 100, 200 described above in connection with representative embodiments. The method described is merely illustrative and it is emphasized that other methods of fabricating the substrates 101, 201 and the semiconductor packages 100), 200 will become apparent to one of ordinary skill in the art having had the benefit of review of the present disclosure.

FIG. 4A shows the forming of first seed layers 402 over a carrier 401. As will become apparent as the present description continues, the first seed layers 402 are selected based on the material selected for the substrate vias and capture pads of the substrates 101, 201. In a representative embodiment, the first seed layers 402 comprise copper (Cu) having a thickness on the order of approximately 1.0 μm.

FIG. 4B shows the forming of first substrate vias 403 over respective first seed layers 402. The first substrate vias 403 illustratively comprise copper and have a thickness in the range of approximately 5.0 μm to approximately 50 μm.

Illustratively, the first substrate vias 403 are formed using an electroplating method or a sputtering method known to one of ordinary skill in the art.

FIG. 4C shows the forming of a first dielectric layer 404 over the first substrate vias 403, first seed layers 402 and carrier 401. The first dielectric layer 404 may be formed by a known lamination technique or by a known deposition technique. The first dielectric layer 404 illustratively comprises one of the dielectric materials listed above. Alternatively, a ceramic material may be provided instead of the dielectric material. The ceramic material may be one of the ceramic materials listed above and may be formed using a known method. After forming of the first dielectric layer 404, another carrier 405 is provided thereover. The carrier 405 comprises the material selected for the first substrate vias 403 and is laminated over the first dielectric layer 404.

FIG. 4D shows the structure after removal of the carrier 401.

FIG. 4E shows the forming of a second seed layer 406 over the first dielectric layer 404 and the first seed layers 402. The second seed layer 406 comprises the same material as the first seed layers 402 and has a thickness on the order of approximately 1.0 μm. The second seed layer 406 is formed by a known electroplating or a known sputter deposition method.

FIG. 4F shows the forming of a layer 407 over the second seed layer 406. The layer 407 comprises the same material as the second seed layer 406 and has a thickness on the order of approximately 1.0 μm. The layer 407 is formed by a known electroplating or a known sputter deposition method.

FIG. 4G shows the forming of second substrate vias 408 over the layer 407. The second substrate vias 408 comprise the same material as the layer 407 and are illustratively formed by a known electroplating or a known sputter deposition method to a thickness in the range of approximately 5.0 μm to approximately 50 μm.

FIG. 4H shows the selective removal of the second seed layer 406 by a known etching technique. The selective removal of the second seed layer 406 reveals first capture pads 409. Notably, the second substrate vias 408 have a width (in the x-direction according to the coordinate system shown in FIG. 4G) that is less than the width of first capture pads 409 over which the second substrate vias 408 are formed. The areal dimension (in the x-y plane in the coordinate system shown in FIG. 4G) of the second substrate vias 408 is also less than the areal dimension of the first capture pads 409. The boundary of the first dielectric layer 404 is distinguished in the drawing with a dashed-line as shown in FIG. 4H.

FIG. 4I shows the forming of the second dielectric layer 410 over the first dielectric layer 404, the first capture pads 409 and the second substrate vias 408. The first dielectric layer 404 may be formed by a known lamination technique or by a known deposition technique. The second dielectric layer 410 illustratively comprises one of the dielectric materials listed above. Alternatively, a ceramic material may be provided instead of the dielectric material. The ceramic material may be one of the ceramic materials listed above and may be formed using a known method. Again, the boundary of the first dielectric layer 404 and the second dielectric layer 410 is identified with a dashed line as shown in FIG. 4I.

FIG. 4J shows the structure after removal of the other carrier 405, and the front-side and back side grinding of the first dielectric layer 404 and the second dielectric layer 410.

FIG. 4K shows the forming of a third seed layer 411 and a fourth seed layer 412 on opposing sides of the first dielectric layer 404, the second dielectric layer 410; the first substrate vias 403 and the second substrate vias 408, all respectively. The third and fourth seed layers 411, 412, each comprise the same material as the first seed layers 402 and have a thickness on the order of approximately 1.0 μm. The third and fourth seed layers 411, 412 are formed by a known electroplating or a known sputter deposition method.

FIG. 4L shows the forming of layers 413 and layers 414 over the third seed layer 411 and the fourth seed layer 412. Layers 413, 414 each comprises the same material as the third and fourth seed layers 411, 412 and each has a thickness on the order of approximately 1.0 μm. The layers 413, 414 are formed by a known electroplating or a known sputter deposition method.

FIG. 4M shows the forming of third substrate vias 415 over layers 413 and the forming of fourth substrate vias 416 over layers 414. The third and fourth substrate vias 415, 416 comprise the same material as the layers 413, 414 and are illustratively formed by a known electroplating or a known sputter deposition method to a thickness in the range of approximately 5.0 μm to approximately 50 μm.

FIG. 4N shows the forming of a third dielectric layer 417 over the third substrate vias 415 and the forming of a fourth dielectric layer 418 over the fourth substrate vias 416. Notably, the forming of the third and fourth dielectric layers 417, 418 is effected after the selective etching to remove layers 413, 414 to reveal second capture pads 419 and third capture pads 420. As shown in FIG. 4N, the third substrate vias 415 have a smaller width (x-direction in the coordinate system shown) than the second capture pads 419, and therefore a smaller areal dimension in the x-y plane of the coordinate system shown in FIG. 4N. Moreover, fourth substrate vias 416 have a smaller width (x-direction in the coordinate system shown in FIG. 4N) than the third capture pads 420, and therefore a smaller areal dimension in the x-y plane in the coordinate system shown in FIG. 4N. However, the fourth substrate vias 416 have a greater areal dimension than the third substrate vias 415. Notably, the successive increase in areal dimension of the substrate vias described above in connection with representative of FIGS. 1 and 2 is provided.

FIG. 4O shows the structure after front-side and back side grinding of the third and fourth dielectric layers 417, 418 to present a first side 421 and a second side 422 of a substrate 400. First contact pads 423 are formed over the first side 421 and second contact pads 424 are formed over the second side 422. The first and second contact pads 423, 424 are formed by forming a seed layer (not shown in FIG. 4O), depositing a layer (not shown in FIG. 4O) of material over the seed layer, and selectively etching the seed layer. As should be appreciated, the processes and materials forming of the first and second contact pads 423,424 are substantially identical to the processes and materials used in the formation of first capture pads 409-third capture pads 420.

As can be appreciated from a review of FIG. 4O, vias 425 extend through the dielectric layers 417,404,410 and 418 and electrically and thermally connect the first contact pads 423 to the respective second contact pads 424. Illustratively, the first contact pads 423 have an areal dimension (where the areal dimension is in the x-y plane according to the coordinate system of FIG. 4O) that is less than an areal dimension (where the areal dimension is in the x-y plane according to the coordinate system of FIG. 4O) of the second contact pads 424. The resultant vias 425 have a somewhat overall "trapezoidal" shape with increasing areal dimension between the first side 421 and the second side 422 of the substrate 400. Again, the somewhat "step-wise" nature of the trapezoidal shape results from the limitations of known photolithographic methods used to fabricate the substrate 400. As noted above, this "step-wise" nature of the trapezoidal shape of the vias 425 is merely illustrative and is not essential.

Figure 5:
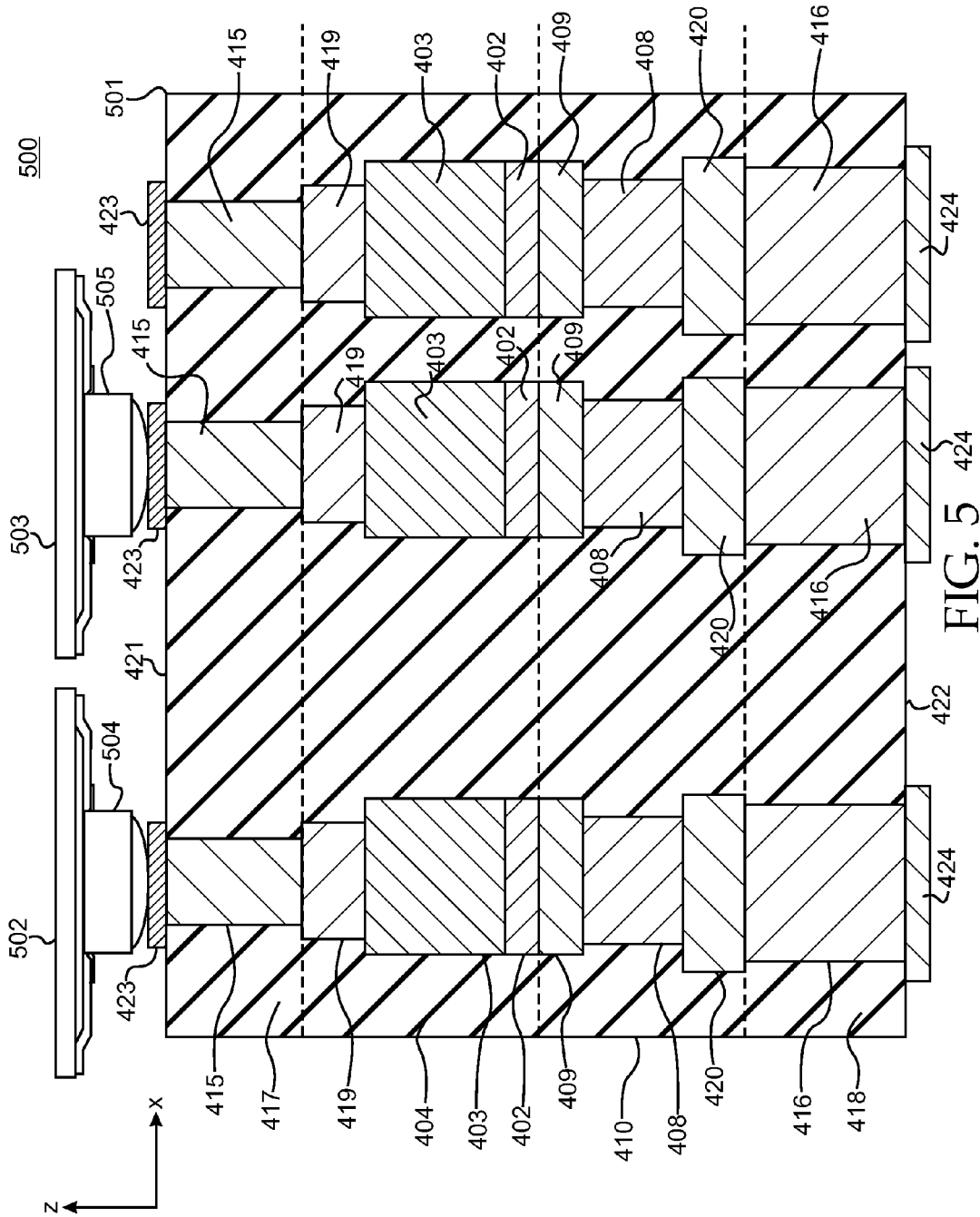
FIG. 5 shows a semiconductor package in accordance with a representative embodiment.

FIG. 5 shows a cross-sectional view of a semiconductor package 500 in accordance with a representative embodiment. Many of the details of the semiconductor package 500 are common to details of representative embodiments described in connection with FIGS. 1-4O. The semiconductor package 500 comprises a substrate 501, comprising vias 425. The substrate 501 and vias 425 are illustratively fabricated in accordance with the processing sequence and with the illustrative materials described in connection with the representative embodiments of FIGS. 4A-4O. It is emphasized that other methods of fabrication and materials are contemplated. For example, the layers of the substrate 501 may comprise ceramic material(s) as noted above.

A first semiconductor die 502 is provided over one of the first contact pads 423 and a second semiconductor die 503 is provided over another of the first contact pads 423. In the presently described representative embodiment, the first semiconductor die 502 is connected electrically and thermally to the first contact pad 423 by a first pillar 504; and the second semiconductor die 503 is connected electrically and thermally to the first contact pad 423 by a second pillar 505. As should be appreciated, additional semiconductor die (not shown) may be provided over further vias 425 and through first contact pads 423.

Illustratively, the first and second pillars 504,505 are as described in commonly owned U.S. patent application Ser. No. 12/846,060 entitled "Semiconductor Structure Comprising Pillar" filed on Jul. 29, 2010 to Ray Parkhurst, et al. The disclosure of this patent application is specifically incorporated herein by reference. The first and second pillars 504,505 provide an electrical connection and a thermal conduction path between the first and second semiconductor die 502, 503, respectively, and the respective first contact pads 423, which are disposed over a first side 421 of the substrate 501.

The first and second semiconductor die 502,503 each illustratively comprises an active semiconductor device (not shown), and may comprise passive electrical components (not shown) and circuit traces (not shown). The active semiconductor device is fabricated from a semiconductor material. Illustrative semiconductor materials for the active semiconductor device include binary semiconductor materials (e.g., Group III-IV and Group IV-VI semiconductor materials), ternary semiconductor materials, silicon (Si) and silicon-germanium (SiGe). Moreover, the present teachings contemplate the use of synthetic diamond fabricated by a known chemical vapor deposition (CVD) method.

Illustratively, the active semiconductor device of the first and second semiconductor die 502,503 is a heterojunction bipolar transistor (HBT). It is emphasized that the selection of GaAs for the semiconductor material and the selection of the HBT device are merely illustrative, and other semiconductor materials and active devices (electronic and optoelectronic) are contemplated. Illustratively, the active device may be a pseudomorphic high electron mobility transistor (pHEMT). Alternatively, the semiconductor material may comprise silicon and the active device may comprise a metal oxide semiconductor (MOS) device such as a MOS field effect transistor (MOSFET) or complementary MOS (CMOS) device. Additionally, the first and second semiconductor die 502,503 may comprise a combination of a plurality of the different active semiconductor devices to provide a desired circuit. Furthermore, the active devices of the first and second semiconductor die 502, 503 may provide power amplifiers and other devices that require heat dissipation. While such power devices are illustrative, other active semiconductor devices that do not require the same degree of heat dissipation as power devices (e.g., power amplifiers) are contemplated to be included in the first and second semiconductor die 502,503.

Figure 6:
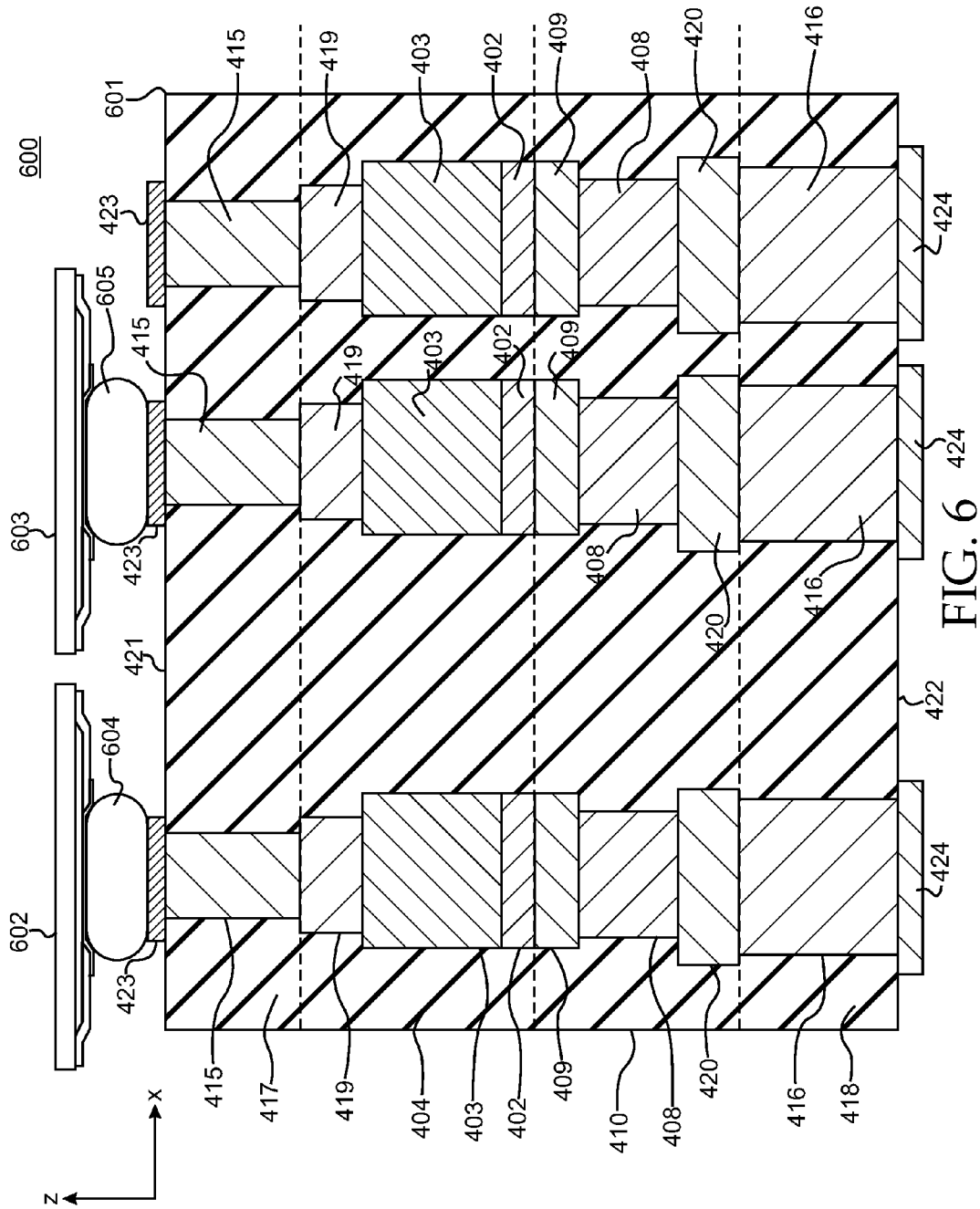
FIG. 6 shows a semiconductor package in accordance with a representative embodiment.

FIG. 6 shows a cross-sectional view of a semiconductor package 600 in accordance with a representative embodiment. Many of the details of the semiconductor package 600 are common to details of representative embodiments described in connection with FIGS. 1-5. The semiconductor package 600 comprises a substrate 601, comprising vias 425. The substrate 601 and vias 425 are illustratively fabricated in accordance with the processing sequence and with the illustrative materials described in connection with the representative embodiments of FIGS. 4A-4O. It is emphasized that other methods of fabrication and materials are contemplated. For example, the layers of the substrate 601 may comprise ceramic material(s) as noted above.

A first semiconductor die 602 is provided over one of the first contact pads 423 and a second semiconductor die 603 is provided over another of the first contact pads 423. In the presently described representative embodiment, the first semiconductor die 602 is connected electrically and thermally to the first contact pad 423 by a first solder bump 604; and the second semiconductor die 603 is connected electrically and thermally to the first contact pad 423 by a second solder bump 605. As should be appreciated, additional semiconductor die (not shown) may be provided over further vias 425 and through first contact pads 423.

The first and second solder bumps 604,605 provide an electrical connection and a thermal conduction path between a first and second semiconductor die 602, 603, respectively, and the respective first contact pads 423, which are disposed over a first side 421 of the substrate 601.

The first and second semiconductor die 602,603 each illustratively comprises an active semiconductor device (not shown), and may comprise passive electrical components (not shown) and circuit traces (not shown). The active semiconductor device is fabricated from a semiconductor material. Illustrative semiconductor materials for the active semiconductor device include binary semiconductor materials (e.g., Group III-IV and Group IV-VI semiconductor materials), ternary semiconductor materials, silicon (Si) and silicon-germanium (SiGe). Moreover, the present teachings contemplate the use of synthetic diamond fabricated by a known chemical vapor deposition (CVD) method.

Illustratively, the active semiconductor device of the first and second semiconductor die 602,603 is a heterojunction bipolar transistor (HBT). It is emphasized that the selection of GaAs for the semiconductor material and the selection of the HBT device are merely illustrative, and other semiconductor materials and active devices (electronic and optoelectronic) are contemplated. Illustratively, the active device may be a pseudomorphic high electron mobility transistor (pHEMT). Alternatively, the semiconductor material may comprise silicon and the active device may comprise a metal oxide semiconductor (MOS) device such as a MOS field effect transistor (MOSFET) or complementary MOS (CMOS) device. Additionally, the first and second semiconductor die 602,603 may comprise a combination of a plurality of the different active semiconductor devices to provide a desired circuit. Furthermore, the active devices of the first and second semiconductor die 602, 603 may provide power amplifiers and other devices that require heat dissipation. While such power devices are illustrative, other active semiconductor devices that do not require the same degree of heat dissipation as power devices (e.g., power amplifiers) are contemplated to be included in the first and second semiconductor die 602,603.

Figure 7:
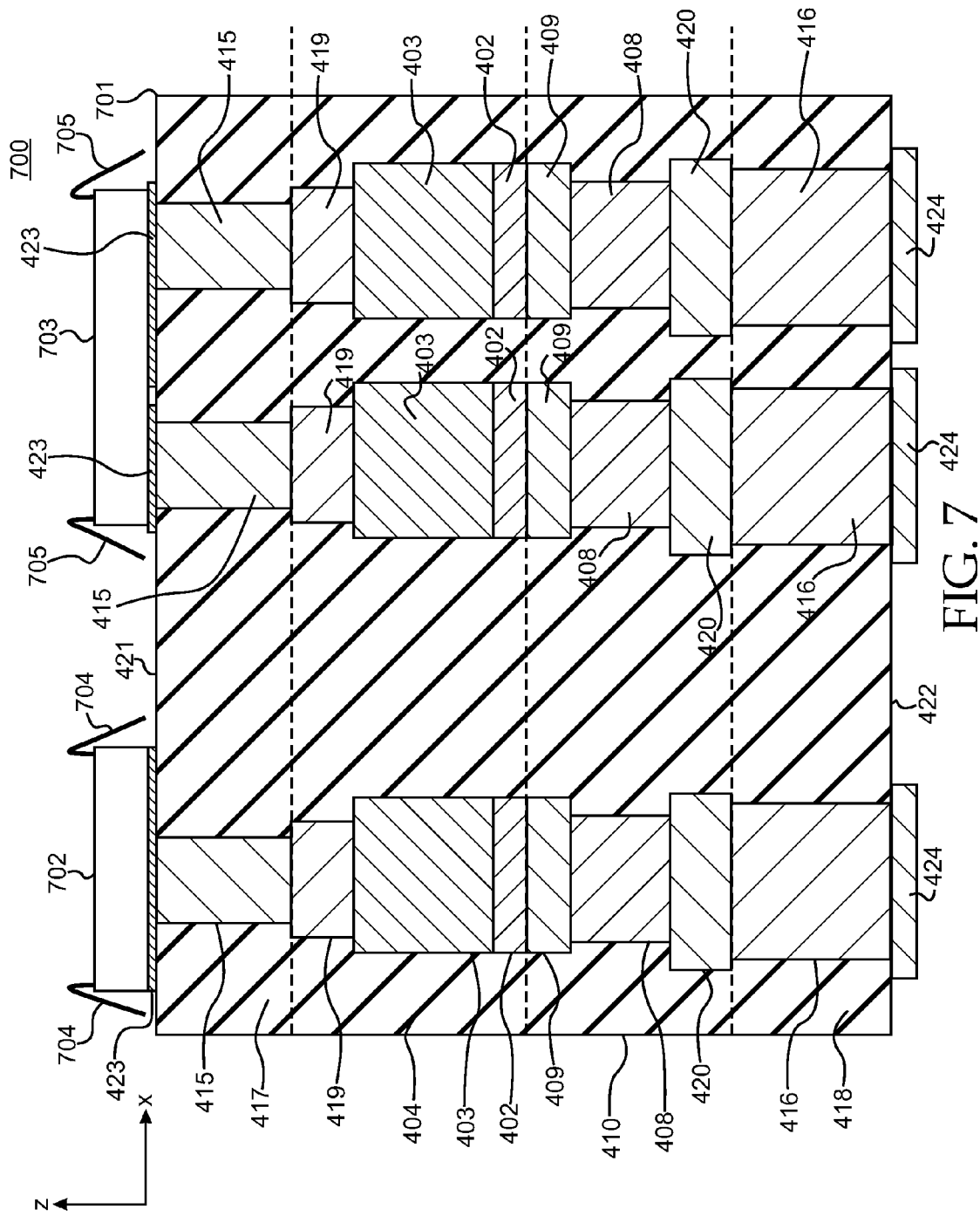
FIG. 7 shows a semiconductor package in accordance with a representative embodiment.

FIG. 7 shows a cross-sectional view of a semiconductor package 700 in accordance with a representative embodiment. Many of the details of the semiconductor package 700 are common to details of representative embodiments described in connection with FIGS. 1-6. The semiconductor package 700 comprises a substrate 701, comprising vias 425. The substrate 701 and vias 425 are illustratively fabricated in accordance with the processing sequence and with the illustrative materials described in connection with the representative embodiments of FIGS. 4A-4O. It is emphasized that other methods of fabrication and materials are contemplated. For example, the layers of the substrate 601 may comprise ceramic material(s) as noted above. A first semiconductor die 702 is provided over one of the first contact pads 423. A second semiconductor die 703 is provided over two adjacent the first contact pads 423, and therefore, over two adjacent vias 425. Providing the second semiconductor die 703 over multiple vias fosters improved electrical performance of a semiconductor device of second semiconductor die 703. As is known, the electrical performance of semiconductor devices often depends on its operating temperature. Providing the second semiconductor die 703 over multiple vias 725 improves thermal dissipation compared to use of a single via, as may be required depending on the semiconductor device. This improved thermal dissipation can extend battery life and lower electrical noise of the semiconductor device.

In the presently described representative embodiment, the first semiconductor die 702 is connected electrically to contacts (not shown) by first wire bonds 704; and the second semiconductor die 603 is connected electrically to contacts (not shown) by a second wire bonds 705. As should be appreciated, additional semiconductor die (not shown) may be provided over further vias 425 and through first contact pads 423.

The first and second semiconductor die 702,703 each illustratively comprises an active semiconductor device (not shown), and may comprise passive electrical components (not shown) and circuit traces (not shown). The active semiconductor device is fabricated from a semiconductor material. Illustrative semiconductor materials for the active semiconductor device include binary semiconductor materials (e.g., Group III-IV and Group IV-VI semiconductor materials), ternary semiconductor materials, silicon (Si) and silicon-germanium (SiGe). Moreover, the present teachings contemplate the use of synthetic diamond fabricated by a known chemical vapor deposition (CVD) method.

Illustratively, the active semiconductor device of the first and second semiconductor die 702,703 is a heterojunction bipolar transistor (HBT). It is emphasized that the selection of GaAs for the semiconductor material and the selection of the HBT device are merely illustrative, and other semiconductor materials and active devices (electronic and optoelectronic) are contemplated. Illustratively, the active device may be a pseudomorphic high electron mobility transistor (pHEMT). Alternatively, the semiconductor material may comprise silicon and the active device may comprise a metal oxide semiconductor (MOS) device such as a MOS field effect transistor (MOSFET) or complementary MOS (CMOS) device. Additionally, the first and second semiconductor die 702,703 may comprise a combination of a plurality of the different active semiconductor devices to provide a desired circuit. Furthermore, the active devices of the first and second semiconductor die 702, 703 may provide power amplifiers and other devices that require heat dissipation. While such power devices are illustrative, other active semiconductor devices that do not require the same degree of heat dissipation as power devices (e.g., power amplifiers) are contemplated to be included in the first and second semiconductor die 702,703.

In view of this disclosure it is noted that the various semiconductor packages and active semiconductor devices can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

The invention claimed is:

1. A semiconductor package, comprising:
a substrate comprising a plurality of layers, a first side and a second side; and a via extending through the substrate from the first side to the second side, the via comprising:
a first substrate via extending through a first layer of the plurality of layers, the first substrate via having a first cross-sectional area;
a first capture pad disposed under the first substrate via, wherein the first capture pad physically contacts the first substrate via on a first side and is adapted to electrically contact a semiconductor die disposed over a top of a second side opposing the first side;
a second substrate via extending through a second layer of the plurality of layers, the second substrate via physically contacting the first capture pad, the second substrate via having a second cross-sectional area that is greater than the first cross-sectional area; and
a second capture pad disposed under the second substrate via, the second capture pad having a second cross-sectional area that is greater than the first cross-sectional area, wherein the second capture pad physically contacts the second substrate via;
a third substrate via extending through a third layer of the plurality of layers, the third substrate via having a third cross-sectional area that is greater than the second cross-sectional area, wherein the third substrate via physically contacts the second capture pad; and
a third capture pad disposed under the third layer, wherein the third capture pad physically contacts the third substrate via.

2. A semiconductor package as claimed in claim 1, wherein the first capture pad has a first cross-sectional areal dimension and the second capture pad has a second cross-sectional areal dimension, which is greater than the first cross-sectional areal dimension, and the third capture pad has a third cross-sectional areal dimension that is greater than the second cross-sectional area dimension.

3. A semiconductor package as claimed in claim 1, wherein each of the plurality of layers comprises a dielectric material.

4. A semiconductor package as claimed in claim 1, wherein each of the plurality of layers comprises a ceramic material.

5. A semiconductor package as claimed in claim 1, further comprising a contact pad disposed over the first side of the substrate.

6. A semiconductor package as claimed in claim 5, further comprising a solder bump disposed over the contact pad.

7. A semiconductor package as claimed in claim 6, wherein the die is disposed over the solder bump.

8. A semiconductor package as claimed in claim 5, wherein the die is disposed over the contact pad.

9. A substrate, comprising:
a plurality of layers, a first side and a second side; and a via extending through the plurality of layers from the first side to the second side, the via comprising:

a first substrate via extending through a first layer of the plurality of layers, the first substrate via having a first cross-sectional area;

a first capture pad disposed under the first substrate via, wherein the first capture pad physically contacts the first substrate via on a first side and is adapted to electrically contact a semiconductor die disposed over a top of a second side opposing the first side;

a second substrate via extending through a second layer of the plurality of layers, the second substrate via physically contacting the first capture pad, the second substrate via having a second cross-sectional area that is greater than the first cross-sectional area; and a second capture pad disposed under the second layer, the second capture pad having a second cross-sectional area that is greater than the first cross-sectional area, wherein the second capture pad physically contacts the second substrate via;

a third substrate via extending through a third layer of the plurality of layers, the third substrate via having a third cross-sectional area that is greater than the second cross-sectional area, wherein the third substrate via physically contacts the second capture pad; and a third capture pad disposed under the third layer, wherein the third capture pad physically contacts the third substrate via.

10. A substrate as claimed in claim 9, wherein the first capture pad has a first cross-sectional areal dimension and the second capture pad has a second cross-sectional areal dimension, which is greater than the first cross-sectional areal dimension, and the third capture pad has a third cross-sectional areal dimension that is greater than the second cross-sectional area dimension.

11. A substrate as claimed in claim 9, wherein each of the plurality of layers comprises a dielectric material.

12. A substrate as claimed in claim 9, wherein each of the plurality of layers comprises a ceramic material.

13. A substrate as claimed in claim 9, further comprising a contact pad disposed over the first side of the plurality of layers.

14. A semiconductor package, comprising:
a substrate comprising a plurality of layers, a first side and a second side; and a via extending through the substrate from the first side to the second side, the via comprising:
a first substrate via extending through a first layer of the plurality of layers, the first substrate via having a first cross-sectional area;
a first capture pad disposed under the first substrate via, wherein the first capture pad physically contacts the first substrate via;
a second substrate via extending through a second layer of the plurality of layers, the second substrate via physically contacting the first capture pad, the second substrate via having a second cross-sectional area that is greater than the first cross-sectional area; and
a second capture pad disposed under the second substrate via, the second capture pad having a second cross-sectional area that is greater than the first cross-sectional area, wherein the second capture pad physically contacts the second substrate via;
a third substrate via extending through a third layer of the plurality of layers, the third substrate via having a third cross-sectional area that is greater than the second cross-sectional area, wherein the third substrate via physically contacts the second capture pad; and
a third capture pad disposed under the third layer, wherein the third capture pad physically contacts the third substrate via, wherein the first capture pad has a first cross-sectional areal dimension and the second capture pad has a second cross-sectional areal dimension, which is greater than the first cross-sectional areal dimension, and the third capture pad has a third cross-sectional areal dimension that is the same as the second cross-sectional areal dimension.

15. A semiconductor package as claimed in claim 14, wherein each of the plurality of layers comprises a dielectric material.

16. A semiconductor package as claimed in claim 14, wherein each of the plurality of layers comprises a ceramic material.

17. A semiconductor package as claimed in claim 14, further comprising a contact pad disposed over the first side of the substrate.

18. A semiconductor package as claimed in claim 17, further comprising a solder bump disposed over the contact pad.

19. A semiconductor package as claimed in claim 14, wherein the semiconductor die is disposed over the contact pad.

20. A semiconductor package as claimed in claim 19, wherein the semiconductor die is disposed over the solder bump.

21. A substrate, comprising:
a plurality of layers, a first side and a second side; and a via extending through the substrate from the first side to the second side, the via comprising:
a first substrate via extending through a first layer of the plurality of layers, the first substrate via having a first cross-sectional area;
a first capture pad disposed under the first substrate via, wherein the first capture pad physically contacts the first substrate via;
a second substrate via extending through a second layer of the plurality of layers, the second substrate via physically contacting the first capture pad, the second substrate via having a second cross-sectional area that is greater than the first cross-sectional area; and
a second capture pad disposed under the second layer, the second capture pad having a second cross-sectional area that is greater than the first cross-sectional area, wherein the second capture pad physically contacts the second substrate via;
a third substrate via extending through a third layer of the plurality of layers, the third substrate via having a third cross-sectional area that is greater than the second cross-sectional area, wherein the third substrate via physically contacts the second capture pad; and
a third capture pad disposed under the third layer, the third capture pad physically contacting the third substrate via, wherein the first capture pad has a first cross-sectional areal dimension and the second capture pad has a second cross-sectional areal dimension, which is greater than the first cross-sectional areal dimension, and the third capture pad has a third cross-sectional areal dimension that is the same as the second cross-sectional areal dimension.

22. A semiconductor package as claimed in claim 21, wherein each of the plurality of layers comprises a dielectric material.

23. A semiconductor package as claimed in claim 21, wherein each of the plurality of layers comprises a ceramic material.

24. A semiconductor package as claimed in claim 21, further comprising a contact pad disposed over the first side of the plurality of layers.

25. A semiconductor package as claimed in claim 24, further comprising a solder bump disposed over the contact pad.

26. A semiconductor package as claimed in claim 25, wherein the semiconductor die is disposed over the solder bump.

27. A semiconductor package as claimed in claim 21, wherein the semiconductor die is disposed over the contact pad.

* * * * *